(12) United States Patent
Otte et al.

(10) Patent No.: US 10,308,502 B2
(45) Date of Patent: Jun. 4, 2019

(54) SEMICONDUCTOR PRESSURE SENSOR FOR HARSH MEDIA APPLICATION

(71) Applicant: MELEXIS TECHNOLOGIES NV, Tessenderlo (BE)

(72) Inventors: Laurent Otte, Brussels (BE); Jian Chen, Heist-op-den-Berg (BE); Appolonius Jacobus Van Der Wiel, Duisburg (BE)

(73) Assignee: MELEXIS TECHNOLOGIES NV, Tessenderlo (BE)

( * ) Notice: Subject to any disclaimer, the term of this patent is extended or adjusted under 35 U.S.C. 154(b) by 0 days.

(21) Appl. No.: 15/445,096

(22) Filed: Feb. 28, 2017

(65) Prior Publication Data

US 2017/0247250 A1    Aug. 31, 2017

(30) Foreign Application Priority Data

Feb. 29, 2016    (EP) .................................... 16157961

(51) Int. Cl.
*B81B 7/00*    (2006.01)
*B81C 1/00*    (2006.01)
(Continued)

(52) U.S. Cl.
CPC .......... *B81B 7/0058* (2013.01); *B81C 1/0023* (2013.01); *G01L 9/0054* (2013.01); *G01L 19/0645* (2013.01); *G01L 19/147* (2013.01); *G01L 23/24* (2013.01); *B81B 2201/0264* (2013.01); *B81B 2207/012* (2013.01); (Continued)

(58) Field of Classification Search
CPC ................ B81B 7/0032; B81B 7/0058; B81B 2201/0264; B81B 2207/012; B81B 2207/01; B81C 1/0023; B81C 1/00222; G01L 19/147; G01L 23/24
See application file for complete search history.

(56) References Cited

U.S. PATENT DOCUMENTS 5,877,425 A    3/1999 Suzuki et al.
5,948,991 A    9/1999 Nomura et al.
(Continued)

FOREIGN PATENT DOCUMENTS

DE    19754616 A1    6/1998
DE    102011013912 A1    9/2012
(Continued)

OTHER PUBLICATIONS

European Search Report from EP Application No. 16157961.0, dated Aug. 4, 2016.

*Primary Examiner* — Nathan W Ha
(74) *Attorney, Agent, or Firm* — Workman Nydegger

(57) ABSTRACT

A semiconductor pressure sensor assembly for measuring a pressure of an exhaust gas which contains corrosive components, comprising: a first cavity, a pressure sensor comprising first bondpads for electrical interconnection, a CMOS chip comprising second bondpads for electrical interconnection with the pressure sensor, an interconnection module having electrically conductive paths connected via bonding wires to the pressure sensor and to the CMOS chip; the interconnection module being a substrate with corrosion-resistant metal tracks, wherein the CMOS chip and part of the interconnection module are encapsulated by a plastic package.

20 Claims, 12 Drawing Sheets

(51) Int. Cl.
  *G01L 9/00* (2006.01)
  *G01L 19/06* (2006.01)
  *G01L 19/14* (2006.01)
  *G01L 23/24* (2006.01)

(52) U.S. Cl.
  CPC ..... *B81B 2207/07* (2013.01); *B81B 2207/098* (2013.01); *B81B 2207/115* (2013.01); *B81C 2203/0792* (2013.01); *H01L 2224/48091* (2013.01); *H01L 2224/48137* (2013.01)

(56) References Cited

U.S. PATENT DOCUMENTS

| | | | |
|---|---|---|---|
| 7,536,917 | B2 | 5/2009 | Baba |
| 7,992,441 | B2 | 8/2011 | Mulligan et al. |
| 9,200,974 | B2 | 12/2015 | Matsunami et al. |
| 2003/0200813 | A1 | 10/2003 | Baba et al. |
| 2005/0034526 | A1 | 2/2005 | Shinyama et al. |
| 2005/0269654 | A1 | 12/2005 | Tanaka et al. |
| 2008/0190209 | A1 | 8/2008 | Baba |
| 2009/0140405 | A1* | 6/2009 | Maruo ............... H01L 23/055 257/680 |
| 2009/0218643 | A1 | 9/2009 | Kaminaga et al. |
| 2010/0055821 | A1* | 3/2010 | Buhler ............ B81C 1/00087 438/51 |
| 2010/0102457 | A1* | 4/2010 | Topacio ............ H01L 21/565 257/777 |
| 2010/0176467 | A1* | 7/2010 | Fukasawa ........ B81C 1/00269 257/416 |
| 2011/0156176 | A1* | 6/2011 | Huckabee .......... B81B 7/0061 257/414 |
| 2014/0001582 | A1* | 1/2014 | Kuo ............... H01L 23/49575 257/417 |
| 2014/0331777 | A1* | 11/2014 | Tomita ................ G01L 9/06 73/754 |
| 2017/0016790 | A1* | 1/2017 | Van Der Wiel ...... G01L 9/0048 |
| 2017/0150248 | A1* | 5/2017 | Littrell ............... H04R 1/222 |
| 2017/0363492 | A1* | 12/2017 | Chen .................. G01L 19/06 |

FOREIGN PATENT DOCUMENTS

| | | |
|---|---|---|
| FR | 2912506 A1 | 8/2008 |
| GB | 1547592 A | 6/1979 |

* cited by examiner

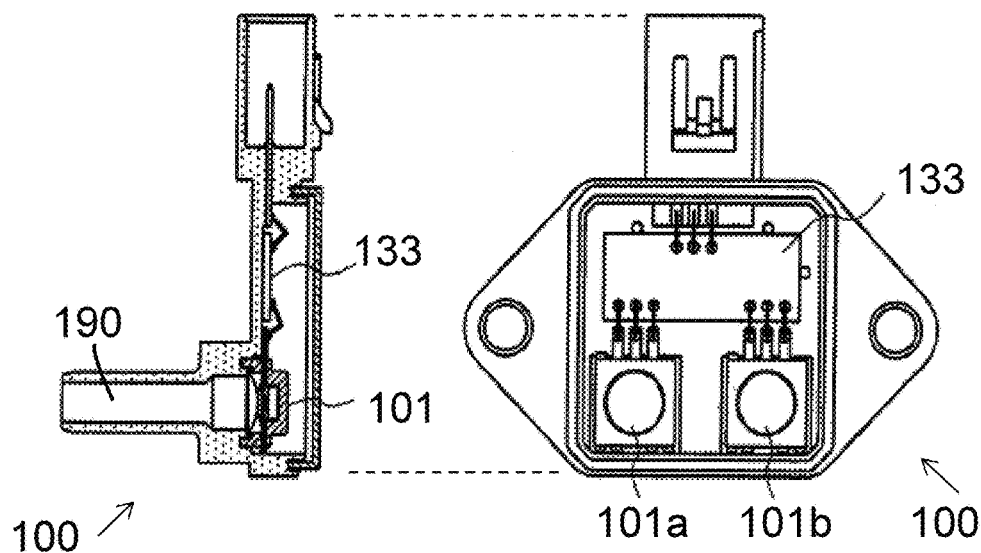
FIG 1 (prior art)  FIG 2 (prior art)
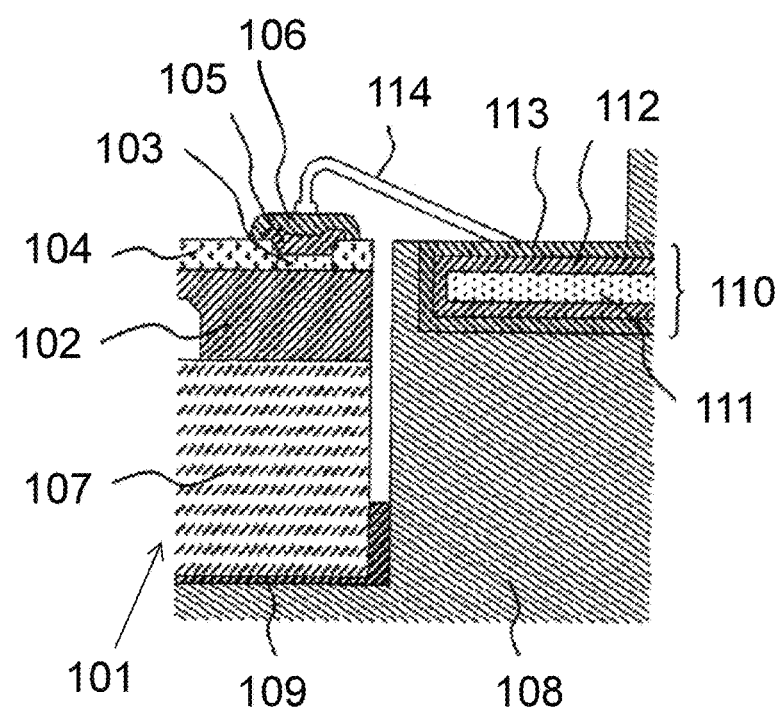
FIG 3 (prior art)

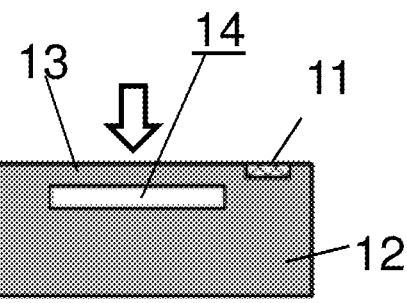
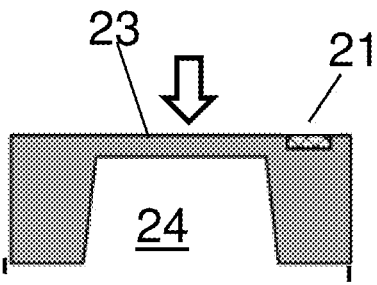
FIG 4
FIG 6
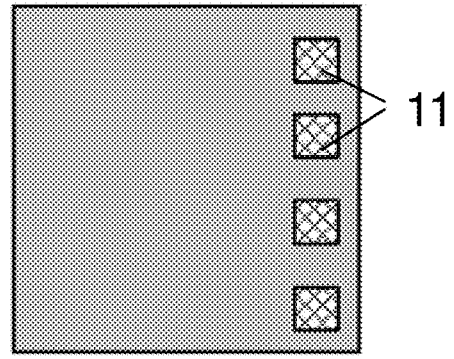
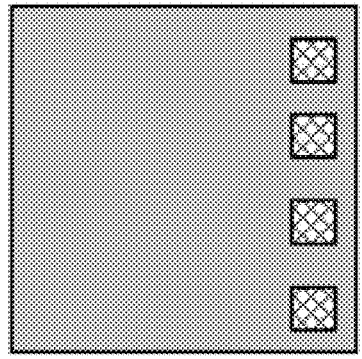
FIG 5
FIG 7

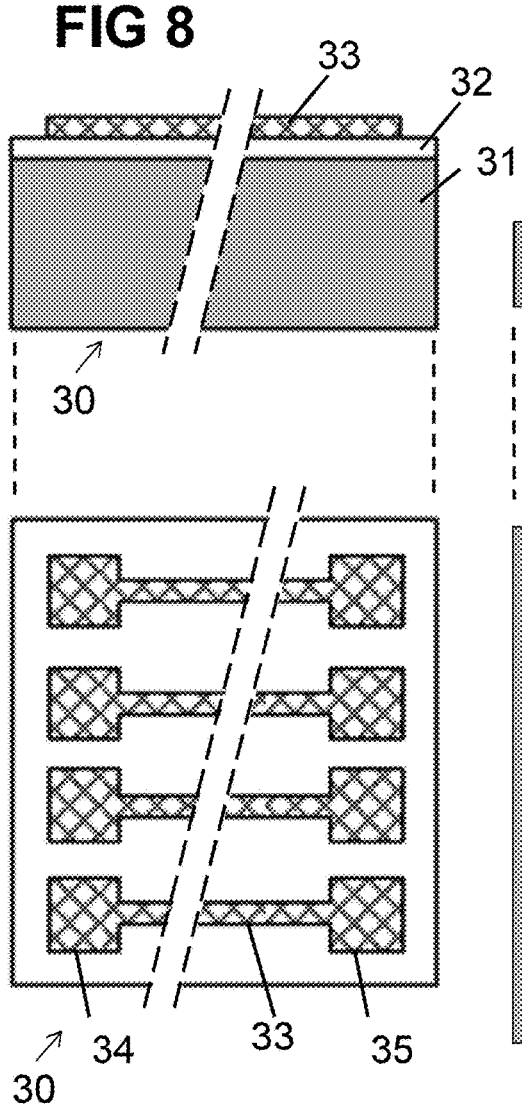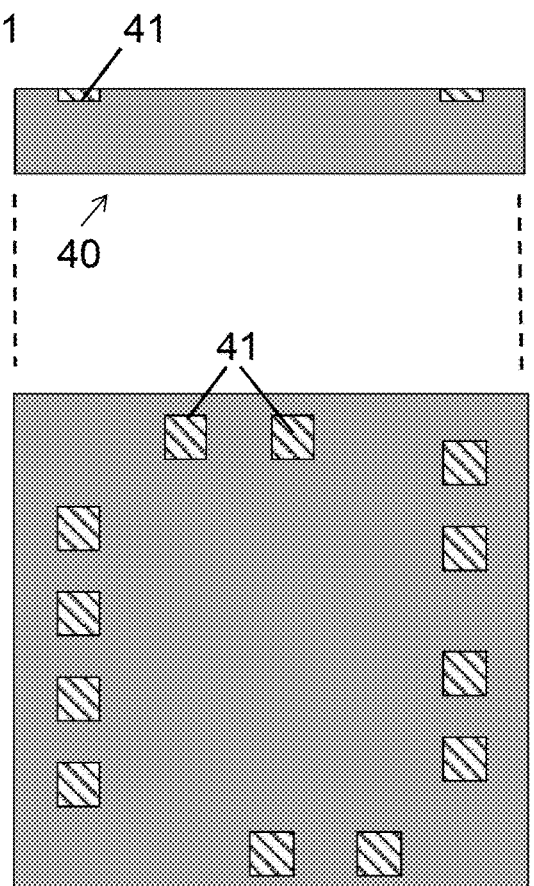

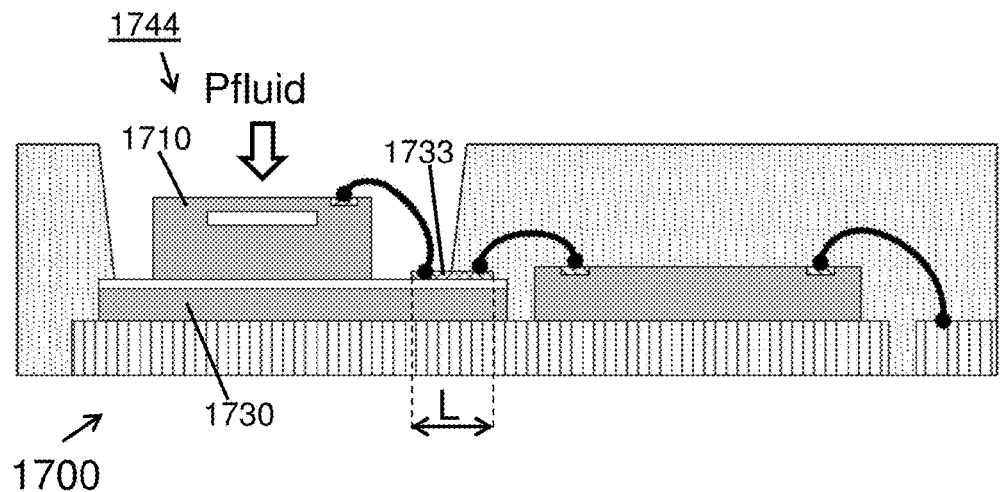
FIG 17
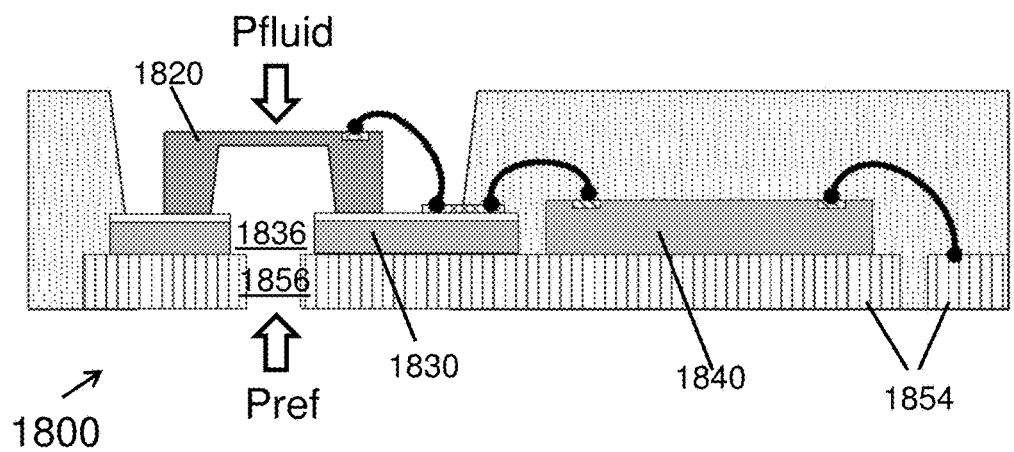

SEMICONDUCTOR PRESSURE SENSOR FOR HARSH MEDIA APPLICATION

FIELD OF THE INVENTION

The present invention relates to the field of pressure sensors, more in particular to semiconductor pressure sensors suitable for measuring a pressure of a fluid (i.e. liquid or gas) that contains or may contain corrosive components, such as an exhaust gas of a vehicle.

BACKGROUND OF THE INVENTION

Semiconductor pressure sensors for measuring a pressure of a fluid such as water or air under moderate temperatures and/or pressures are well known in the art, for example from GB1547592A published in 1979. Typically such sensors comprise a substrate with a thinned portion (called "membrane" or "diaphragm") upon which membrane a pressure sensitive circuit is arranged, for example a Wheatstone-bridge comprising four piezo-resistive elements. Such a substrate typically further comprises four bondpads in electrical contact with nodes of the pressure sensitive circuit, for example two nodes for biasing the circuit with a voltage or current, and two output nodes for sensing a voltage indicative of the mechanical pressure exerted on the membrane by the fluid. Pressure sensors of this kind are well known in the art, and hence need not be further described here.

Although the basic principles of semiconductor pressure sensors have remained largely the same since 1979, there is continuous ongoing development in several directions, for example to add additional functionality on the same die, such as mechanisms for compensating offset and/or digital read-out circuitry, or to make the pressure sensors suitable for harsh media.

The present invention is related to a pressure sensor assembly suitable for measuring a pressure of fluids which may contain corrosive components, such as exhaust gas, wherein the assembly is of the type that comprises a separate pressure sensor and a separate processing circuit electrically connected to said pressure sensor. Existing solutions are for example described in U.S. Pat. No. 9,200,974(B2) and U.S. Pat. No. 7,992,441(B2) and US20090218643(A1). There is always room for improvements or alternatives.

SUMMARY OF THE INVENTION

It is an object of embodiments of the present invention to provide a pressure sensor assembly suitable for measuring a pressure of an exhaust gas from an automobile, which gas contains corrosive components, wherein the assembly is of the type that comprises a separate pressure sensor and a separate readout circuit, in particular a CMOS chip, electrically connected to said pressure sensor.

It is an object of particular embodiments of the present invention to provide such a pressure sensor assembly which is more compact than prior art solutions.

It is an object of particular embodiments of the present invention to provide such a pressure sensor assembly which is less complex or easier to produce (e.g. in terms of number of processing steps or in terms of number of coating stacks).

It is an object of particular embodiments of the present invention to provide such a pressure sensor assembly which has a reduced risk of corrosion and thus an improved lifetime, even in the presence of cracks or crevices.

It is an object of particular embodiments of the present invention to provide such a pressure sensor assembly which requires a smaller amount of expensive materials, in particular a smaller amount of noble metals or alloys comprising noble metals, for example a smaller amount of gold or platinum.

It is an object of particular embodiments of the present invention to provide such a pressure sensor assembly where the length of the interconnection between the cavity exposed to the harsh environment and the protected integrated circuit is reduced, e.g. minimized to build smaller and/or more stable packages.

These objectives are accomplished by an assembly according to embodiments of the present invention.

According to a first aspect, the present invention provides a semiconductor pressure sensor assembly suitable for use under an exhaust gas environment of an automobile engine for measuring a pressure of the exhaust gas which contains corrosive components, the pressure sensor assembly comprising: a first cavity comprising an opening for allowing exposure to said exhaust gas; a pressure sensor arranged in said cavity, the pressure sensor comprising a plurality of first bondpads made of or covered by a first corrosion resistant material; a CMOS chip mounted on a first substrate, the CMOS chip comprising a plurality of first bondpads without corrosion resistant material on top; an interconnection module comprising a second substrate and a plurality of electrically conductive paths made of a second corrosion resistant material, each conductive path having a first bondpad and a second bondpad; the first bondpads of the pressure sensor being connected via first bonding wires to the first bondpads of the interconnection module, the first bonding wires being made of a third corrosion resistant material; the first bondpads of the CMOS chip being connected via second bonding wires to the second bondpads of the interconnection module; wherein the CMOS chip and its first bondpads and the second bondpads of the interconnection module and the second bonding wires and part of the interconnection module are protected from exposure to said fluid by encapsulation with a corrosion resistant plastic material.

The pressure sensor may be a discrete pressure sensor comprising only passive components, such as piezo-resistors. The pressure sensor may comprise a flexible membrane and a pressure sensitive circuit connected to said plurality of first bondpads.

It is an advantage of using a plastic package which encapsulates the CMOS chip and part (for example half) of the interconnection module, that it prevents the CMOS chip from being exposed to the corrosive fluid. The corrosion resistant plastic can for example be an epoxy based "transfer moulding compound", but other suitable plastic materials may also be used. This avoids the need for having to protect the CMOS pad (i.e. a pad made of Al or an Al alloy being the standard metallization materials of CMOS technology) by means of materials such as TiW (to avoid diffusion) and/or Au (corrosion-resistant), or the like.

While competitors are focusing on adding additional metal layers on top of the CMOS chip, require non-standard processes and additional masks, and multiple layers (typically an adhesive layer, and a diffusion-prevention layer and an inert layer), the inventors of the present invention came to the idea of: not coupling the pressure sensor directly to the CMOS chip, but indirectly, via an interconnection module, and by encapsulating the CMOS chip and part of the interconnection module by standard plastic packaging, thereby literally shifting the problem away from the CMOS chip, rather than solving the corrosion on the CMOS chip itself. In this way difficult, expensive and non-standard CMOS process steps can be avoided.

Moreover, contrary to intuition, by replacing the direct connection between the pressure sensor and the CMOS chip, by an indirect connection via the interconnection module, the assembly can also be made more compact, because the plastic encapsulation and the interconnection module allow the pressure sensor to be stacked above (e.g. on top of) the CMOS chip.

Because the interconnection module is made of corrosion-resistant materials, one part thereof can be exposed to the fluid, while another part can be encapsulated by plastic. Thus the transition between the "harsh world" and the "CMOS world" takes place on the interconnection module, rather than at the contact interface of the CMOS chip, as is done in prior art solutions.

It is an advantage that moulding a plastic package is a very mature process and is very well suitable for mass production in both the consumer and automotive industry.

It is an advantage that the interconnection module contains a substrate, because the substrate increases structural integrity.

It is an advantage of using a discrete or separate pressure sensor and a discrete or separate CMOS chip, because this allows to use different technologies for the pressure sensor and for the CMOS chip, hence each can be separately optimized depending on the envisioned applications or environments.

It is an advantage of encapsulating or overmoulding the CMOS chip with a plastics package because this allows a same CMOS chip to be used in assemblies for "harsh" environments and for "normal" environments (such as e.g. ambient air). In particular, by protecting the CMOS chip with a plastic package, the need for additional coating layers (e.g. a TiW-layer and a Au-layer) on top of the second bondpads to withstand the corrosive components of the fluid can be avoided, thus reducing stock inventory and simplifying the manufacturing process.

With the CMOS chip being encapsulated by plastic package is meant (i) that the CMOS chip is completely surrounded by plastic package, or (ii) that the CMOS chip is first mounted to a substrate (for example, a Cu leadframe), which are then completely surrounded by a plastic package, or (iii) that the CMOS chip is first mounted to a substrate (for example, a Cu leadframe), and then the CMOS chip is surrounded by a plastic package on all sides except the side which is mounted to the substrate.

It is an advantage of using an indirect electrical connection between the sensor chip and the CMOS chip by means of said interconnection module comprising electrically conductive paths made of a non-corrosive material (e.g. Gold), as compared to some prior art solutions where the sensor chip and the CMOS chip are located relatively far apart, and wherein noble traces on the substrate bridge the separation between the harsh environment with the sensor (on the one hand) and the non-harsh environment with the CMOS chip (on the other hand), because the structure of the present invention allows (1) to encapsulate or at least cover the CMOS chip, or at least the bondpads of the CMOS chip with the mould compound, which protects the chip without moving the CMOS chip away from the sensor device, and (2) to reduce, e.g. minimize the length or patterning area of the conductive traces (e.g. Gold or Platinum trances) on the interconnection module, which reduces the material cost, and thus reduces the production cost.

In other words, the present invention provides a new insight or a new teaching that the CMOS chip does not have to be moved away from the cavity where the sensor chip is located to sense the exhaust gas, but can actually be located very nearby the sensor, or even underneath the sensor. According to the present invention, this is made possible by encapsulating the CMOS with mold compound (or at least by covering the bondpads of the CMOS chip with mold compound) so as to protect it against the harsh environment, and by providing the interconnection module as described above. As far as is known to the inventors, this "insight" or "teaching" is not known in the art, on the contrary, many prior art documents state or at least seem to suggest that the CMOS chip needs to be fully separated from the cavity that is exposed to the exhaust gas.

The skilled person having the benefit of the present disclosure will understand that the cost of the interconnection module roughly scales with its size.

In an embodiment, the area of the interposer is smaller than the area of the sensor chip, or stated in other words: an area of a cross-section of the interconnection module in a plane parallel to the first substrate is smaller than an area occupied by the sensor chip in the same or another plane parallel to the first substrate.

The interconnection module of such embodiments are fundamentally different in size compared to corresponding metal parts in some prior art devices. There are prior art documents where the sensor chip is mounted on top of an interface, and hence it is not obvious to make that interface smaller than the sensor chip, because the interface serves also as a mechanical support for the sensor chip.

In an embodiment, the first substrate is a lead frame made of a corrosive material, for example made from aluminum or copper or an aluminum alloy or a copper alloy, but not coated with a noble metal such as gold or platinum.

Partial covering (e.g. coating) the lead frame with a noble metal such as gold or platinum is difficult, fully covering (e.g. coating) the lead frame with a noble metal such as gold or platinum is very expensive and surfaces covered with a noble metal cause problems for the adhesion of the mold compound.

In an embodiment, the first corrosion resistant material is Au or Pt or an alloy consisting of a mixture of Au and Pt, or is an alloy containing at least Au or Pt, preferably for at least 90 weight % of the alloy, for example at least 95.0 weight %.

In an embodiment, the third corrosion resistant material is Au or Pt or an alloy consisting of a mixture of Au and Pt, preferably for at least 90 weight % of the alloy, for example at least 95.0 weight %.

Gold and/or platinum bonding wires are highly corrosion resistant, and excellent electrical conductors. Bonding with gold wires is a standard and very mature process.

In an embodiment, the second corrosion resistant material is a metal different from Aluminum or Copper, or is a metal alloy containing less than 1% Aluminum or Copper, preferably less than 0.1%.

In an embodiment, the second corrosion resistant material is a metal different from Aluminum.

In an embodiment, the second corrosion resistant material is a metal different from Copper.

In an embodiment, the second corrosion resistant material is a metal different from Copper and different from Aluminum.

In an embodiment, the second corrosion resistant material is a metal alloy containing less than 5 atom % aluminum, preferably less than 3 atom % aluminum, preferably less than 2 atom % aluminum, preferably less than 1 atom % aluminum.

In an embodiment, the second corrosion resistant material is a metal alloy containing less than 5 weight % aluminum, preferably less than 3 weight % aluminum, preferably less than 2 weight % aluminum, preferably less than 1 weight % aluminum.

In an embodiment, the second corrosion resistant material is a metal alloy containing less than 5 atom % copper, preferably less than 3 atom % copper, preferably less than 2 atom % copper, preferably less than 1 atom % copper.

In an embodiment, the second corrosion resistant material is a metal alloy containing less than 5 weight % copper, preferably less than 3 weight % copper, preferably less than 2 weight % copper, preferably less than 1 weight % copper.

It is an advantage that the tracks of the interconnection module do not contain Aluminum or Copper, hence are not very susceptive to corrosion by the exhaust gas.

It is an advantage that the tracks of the interconnection module do not contain Aluminum and do not contain Copper, hence are not very susceptive to corrosion by the exhaust gas.

In an embodiment the second corrosion resistant material is a single metal selected from the group consisting of Au, Pt, Pd, Ta, Ti, W, Ag, Mo.

It is an advantage that the tracks of the interconnection module contain only highly-corrosive resistant metals or alloys listed above, because such metals are more corrosion resistant than for example tracks of the same thickness but also containing copper or aluminum. This is especially true for aluminum or copper tracks coated with e.g. a thin gold layer, because cracks in the coating would cause e.g. gold to diffuse into the aluminum, resulting ultimately in corrosion of the aluminum. This is in particular relevant for the first contacts of the interconnection module, and part of the tracks in the immediate vicinity thereof, which are exposed to the fluid (albeit optionally via a gel).

In an embodiment, the second corrosion resistant material is a metal alloy comprising at least one metal selected from the group consisting of Au, Pt, Pd, Ta, Ti, W, Ag, Mo, preferably for at least 90 weight % of the alloy, for example at least 95.0 weight %.

In an embodiment, the second corrosion resistant material is a metal alloy comprising at least two metals selected from the group consisting of Au, Pt, Pd, Ta, Ti, W, Ag, Mo, preferably for at least 90 weight % of the alloy, for example at least 95.0 weight %.

In an embodiment, the second corrosion resistant material is a Ni—Pd—Au alloy.

It is an additional advantage if the tracks of the interconnection module contain mainly gold and/or platinum or a mixture of only gold and platinum, for example if at least 50% or at least 90% or at least 95% of the weight of the metal tracks is gold or platinum, because these metals are highly electrically conductive, hence, the thickness of these layers can be reduced as compared to for example aluminum tracks coated with nickel and gold.

In an embodiment, the interconnection module is arranged next to the CMOS chip, and the pressure sensor is located at least partly above or on top of one or both of the CMOS chip and the interconnection module.

By arranging the pressure sensor above (e.g. at least partly over or on top of) one or both of the CMOS chip and the interconnection module, the thickness of the conductive tracks can be kept small, for example less than 1.0 micron, for example less than 0.50 micron, for example less than 0.45 micron, for example less than 0.40 micron, for example less than 0.35 micron, or even less than 0.30 micron), and that the length of the conductive tracks can be kept very small, hence the amount of material required for forming the tracks can be reduced, hence leading to a cost reduction as compared to prior art arrangements where the pressure sensor is located relatively far away from the CMOS chip, with the interconnection means in between (thus by definition further apart as compared to the case where they are arranged on top of each other).

By arranging the pressure sensor above (or on top of) the CMOS chip or on top of the interconnection substrate, a compact arrangement can be provided. Compactness is highly desirable, not only for cost reasons, but also because it is advantageous to calibrate a smaller sensor. Pressure sensors have to be individually calibrated at different pressures and temperatures, for example for determining an offset value and/or sensitivity value which is typically different for each individual sensor. Having a more compact design allows to speed up the calibration process as the thermal mass of the sensor is reduced allowing for a faster temperature setting on the device, e.g. in the order of maximally 1.0 second per measurement. Or stated in other words, for a given time, more measurement points can be taken, thus the accuracy can be improved.

In an embodiment, the interconnection module is mounted above or on top of the CMOS chip thereby defining a first portion of the CMOS chip which is overlaid by the interconnection module and a second portion of the CMOS chip which is not overlaid; and the second bondpads of the interconnection module and the second bonding wires and the second portion of the CMOS chip which is not overlaid by the interconnection module being encapsulated by the plastic package.

Apart from the advantages already mentioned above, in this embodiment the interconnection module has an additional function besides providing an electrical interconnection, namely to mechanically and chemically protect the first part of the CMOS chip against corrosion.

In addition, this embodiment provides a very compact arrangement.

Moreover, this arrangement allows both the pressure sensor and the CMOS chip to be arranged inside or underneath the first cavity, which allows for a better temperature matching between the pressure sensor and the integrated CMOS chip.

The pressure sensor may be an absolute pressure sensor or a relative pressure sensor.

The pressure sensor may comprise a plurality of piezoresistive elements arranged in a bridge circuit or a differential sensing circuit, the nodes of the bridge circuit being electrically connected to the first bondpads.

Pressure sensors with a membrane on top of which piezo-resistors are arranged, connected in a bridge, e.g. a Wheatstone bridge, are ideally suited for converting even small pressure changes into a (differential) voltage signal.

In an embodiment, the semiconductor pressure sensor assembly further comprises a gel applied in the first cavity on top of the pressure sensor.

It is an advantage of providing a gel on top of the pressure sensor, because it prevents any debris, dust or moisture from having direct access to the sensor. It also provides mechanical protection to the first bonding wires, and electrically and mechanically isolates the bonding wires against e.g. moisture. Suitable gels are for example silicone based or fluoro gels, but other gels may also be used.

In an embodiment, the substrate of the interconnection module is made of a material selected from the group consisting of glass, silicon, germanium, alumina, PCB material, a duroplast.

In particular embodiments, the second bonding wires are made of aluminum or copper or silver or gold or platinum, or combinations hereof.

In an embodiment, the CMOS chip is an integrated circuit comprising a microprocessor and a non-volatile memory.

It is an advantage of such assembly, that a "smart" pressure sensor can be made, which can process the signals from the sensor digitally. Preferably, this integrated circuit comprises a non-volatile memory for storing inter alia calibration data, such as offset data. Such an assembly can provide highly accurate data.

In an embodiment, the CMOS chip further comprises second bondpads connected to the first substrate via third bonding wires, the third bonding wires also being encapsulated by the plastic package.

The third bonding wires can be made of the same material as the second bonding wires. The first substrate can be a Cu lead frame, or can be made of another material.

In an embodiment, the semiconductor pressure sensor assembly has outer dimensions smaller than 5 mm×10 mm×8 mm, for example smaller than 2.4 mm×5.0 mm×4.0 mm, for example smaller than 2.0 mm×3.0 mm×3.0 mm, for example smaller than 1.5 mm×2.0 mm×2.0 mm.

It is a major advantage of embodiments according to the present invention that the outer dimensions of the assembly can be chip scale, which is extremely compact. Such assembly can be mounted nearly everywhere, without noticeably or significantly influencing the flow of the fluid to be measured.

It is a major advantage that an interposer can provide a different height of wire bonding level for the pressure sensor than the leadframe or substrate which is used for connecting the CMOS chip with bonding wires.

It is a major advantage that the interposer can be made smaller (occupying less area as seen from above) than the CMOS chip and/or than the sensor chip, in order to reduce area of depositing noble metals forming the conductive tracks.

According to a second aspect, the present invention provides a method of manufacturing a pressure sensor assembly according the first aspect, the method comprising the steps of: a) providing the first substrate; b) providing the pressure sensor; c) providing the interconnection module; d) providing the CMOS chip; e) mounting the CMOS chip on the first substrate, for example using soldering or using an adhesive; f) mounting the interconnection module on the first substrate or on the CMOS chip, for example using an adhesive; g) applying second bonding wires to interconnect the second pads of the interconnection module and the first pads of the CMOS chip; h) optionally applying third bonding wires to interconnect second pads of the CMOS chip and the first substrate; i) applying a plastic package to cover or encapsulate at least the CMOS chip, and the first pads of the CMOS chip, and the second bonding wires, and the second pads of the interconnection module by a corrosion-resistant plastic, in such a way as to leave the first pads of the interconnection module exposed, and in such a way as to form a cavity sufficiently large to accommodate the pressure sensor; j) mounting the pressure sensor to the first substrate or to the plastic package or to the interconnection module, for example using an adhesive; k) applying first bonding wires to interconnect the first pads of the pressure sensor and the first pads of the interconnection module.

In an embodiment, the bonding of step g) and the bonding of step h) are both present, and are performed as a single bonding step.

Step (i) may optionally comprise: to cover or encapsulate also second pads of the CMOS chip and third bonding wires with which those second pads are connected to the first substrate (e.g. Cu lead frame). But these third bonding wires are not absolutely required, for example in case the CMOS chip has a BGA package, having solder ball soldered to the lead frame.

According to a third aspect, the present invention is related to the use of a semiconductor pressure sensor according to any of the first aspect, for measuring a pressure of an exhaust gas of an automobile engine.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

BRIEF DESCRIPTION OF THE DRAWINGS

FIG. 1 and FIG. 2 show a pressure sensor assembly known in the art, in side view and top view respectively. The assembly comprises a pressure sensor and a discrete processing board.

FIG. 3 shows in more detail how the pressure sensor of FIG. 1 is connected to the discrete processing board in the prior art pressure sensor assembly.

FIG. 4 and FIG. 5 are a schematic representation (in side view and top view) of an exemplary discrete absolute pressure sensor as can be used in embodiments of the present invention, but the present invention is not limited to this specific example (e.g. having a square cross section and having four bondpads), and other absolute pressure sensors may also be used.

FIG. 6 and FIG. 7 are a schematic representation (in side view and top view) of an exemplary discrete relative or differential pressure sensor as can be used in embodiments of the present invention, but the present invention is not limited to use this specific example (e.g. having a square cross section and having four bondpads) and other relative pressure sensors may also be used.

FIG. 8 and FIG. 9 are a schematic representation (in side view and top view) of an exemplary "interconnection module", also referred to herein as "interposer", as can be used in embodiments of the present invention, but the present invention is not limited to use this specific example (having for example only four tracks) and other interposers may also be used.

FIG. 10 and FIG. 11 are a schematic representation (in side view and top view) of an exemplary "CMOS chip" as can be used in embodiments of the present invention, but the present invention is not limited to use this specific example (e.g. having a square cross section and 12 contacts on top) and other CMOS chips can also be used.

FIG. 17 shows another embodiment of an assembly according to the present invention. This embodiment can be seen as a variant of the embodiment of FIG. 12, wherein the pressure sensor is mounted on the interposer which is mounted on the lead frame, the interposer being mounted next to the CMOS chip.

FIG. 18 shows another embodiment of an assembly according to the present invention. This embodiment can be seen as a variant of the embodiment of FIG. 17, but with a relative pressure sensor, and wherein the interposer and the lead frame have an opening towards a reference pressure.

Figure 12:
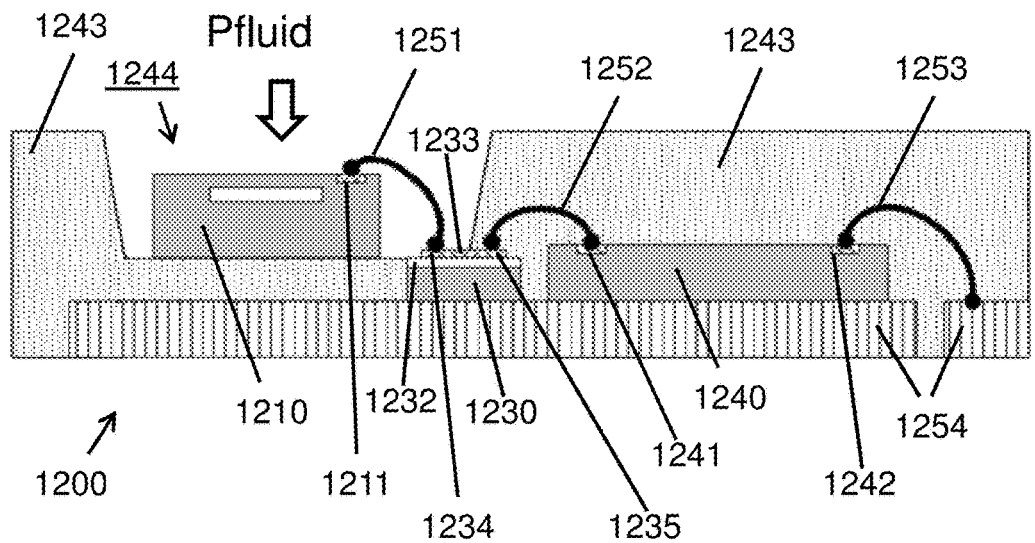
FIG. 12 shows an embodiment of an assembly according to the present invention, in side view. In this embodiment, the pressure sensor is an absolute pressure sensor, the discrete pressure sensor, the interposer and the CMOS chip are arranged on or above a lead frame, next to each other.

The drawings are only schematic and are non-limiting. In the drawings, the size of some of the elements may be exaggerated and not drawn on scale for illustrative purposes. Any reference signs in the claims shall not be construed as limiting the scope. In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Where in this document reference is made to "interposer", what is meant is an "interconnection module" comprising or consisting of a substrate with metal tracks.

In this document reference is made to two substrates: a "first substrate" is a substrate for supporting a CMOS chip. This substrate can be a copper lead frame, but may also be another substrate. The "second substrate" is part of the interposer.

Where in the present invention reference is made to "exhaust gas", what is meant is an exhaust gas of a vehicle such as a car or a bus or a truck having a combustion engine.

The expression "made of" can mean the same as "consisting of".

The expression "covered by" can mean "comprising on an outer surface thereof" or "coated with" or "encapsulated by", etc.

The present invention provides a pressure sensor assembly suitable for measuring a pressure of an exhaust gas of an automobile vehicle. Such gas typically contains corrosive components such as e.g. nitrite ions. In the rest of the document, the invention will only be explained referring to the term "exhaust gas", but the invention will work also for other fluids having corrosive components.

It is well known in the prior art that exhaust gas of a vehicle is corrosive for metals such as for example copper, aluminum and the like, but these are metals typically used for building a lead frame and for metallization of semiconductor devices, especially CMOS devices. Therefore, techniques are proposed in the prior art to prevent or reduce corrosion.

FIG. 1 and FIG. 2 show a pressure sensor assembly 100 known from US2009/0218643(A1), in side view and top view respectively. This pressure assembly has two pressure sensors 101a, 101b interconnected to a discrete processing board 133 by means of so called "terminals" 111 (see FIG. 3). The pressure sensors 101 are located in a cavity in fluid communication with the exhaust gas via channel 190, whereas the processing board 133 is not or only partially exposed to said gas, and is located relatively far away from the pressure sensor.

FIG. 3 shows that the prior art pressure sensor 101 comprises a sensor chip 102, mounted on a glass substrate 107, adhered to a case 108 via an adhesive 109. The sensor chip has a SiN protective layer 104 on top, in which openings are made for electrical contact with the pressure sensitive circuit (not shown). The openings contain aluminum 103, the aluminum is covered with TiW 105, in turn covered with a gold coating 106. The gold coating must be sufficiently thick ("not less than 0.5 micrometer"), which is very thick and thus very expensive. The gold coating 106 is then connected via a golden bonding wire 114 to a so called terminal 110 for electrical contact with the processing board 133 (see FIG. 2). The terminal 110 is a multi-layer stack comprising a "base material" (presumably aluminum or copper) plated with a Ni layer 112, and the Ni layer is plated with a gold layer 113.

Desiring to find at least an alternative for, and preferably to even improve the prior art assembly shown in FIG. 1 to FIG. 3 in terms of corrosion resistance and/or in terms of compactness and/or in terms of component or production cost (e.g. calibration cost), and preferably at least two of these, and even more preferably all of them, the inventors realized that all or most competitors are focusing on trying to find suitable coatings for protecting the pressure chip and/or the processing board or chip. Most solutions deliberately arrange the pressure sensor inside the cavity for exposure to the exhaust gas, while arranging the processing chip outside of said cavity, preferably relatively far apart. They need to provide an electrical interconnection between the pressure sensor and the processor chip, but face the problem that this interconnection is exposed to the exhaust gas at one side thereof, and needs to be connected to the processor chip at the other end thereof. One of the ideas to solve this problem is to use interconnections made of gold, because gold is a corrosion-resistant metal, but the problem is that gold cannot as such be connected to for example aluminum or copper pads of a CMOS chip, because gold diffuses into the aluminum.

In some prior art devices a noble metal is deposited on the lead frame and part of the leadframe is exposed to the harsh media in a pre moulded cavity. This has several disadvantages. It does not allow to make a compact package as the wirebonds between the sensor and the leadframe have to placed away from the CMOS chip, the sensor chip cannot be placed on top of the CMOS chip as standard moulding tools do not allow to make a complex cavity which opens a first area on the leadframe and another area for the sensor above the CMOS chip. Furthermore, it is not cost effective to coat the entire leadframe with a noble layer.

While the rest of the industry seems to be focusing on coating layers for making a good adhesion of such a gold wire, and/or to provide a good diffusion barrier to prevent gold from diffusing into the aluminum or copper pads, the inventors of the present invention took a radically different approach. They decided to start from a CMOS chip having standard metallization layers, i.e. aluminum or copper, and they decided not to provide special coatings on top of this Al or Cu, but came to the idea of (1) adding an interconnection module made of corrosion resistant materials, and (2) to connect one side thereof to the pressure sensor by means of e.g. Au or Pt bonding wires, and (3) to connect another side thereof to the CMOS chip, and (4) to encapsulate the CMOS chip and part of the interconnection module, (e.g. half of the so called interposer) in a plastic package. In this way the CMOS chip is not exposed to the corrosive environment, but part of the interconnection module is exposed, but since the latter is made of corrosive-resistant materials, the interposer can withstand the exhaust gas. At the same time, this indirect connection offers also other advantages, e.g. in terms of process required to make the CMOS chip, inventory of CMOS chips, compactness of the assembly, and cost of calibration process.

While the use of a plastic package to encapsulate a component per se is known, and the use of an interconnection module for electrically interconnecting two different components per se is also known, applying a plastic package to encapsulate one of the components and half of the interconnection module is, as far as the inventors are aware, not known in the art, more particularly in the field of pressure sensors. Indeed, in embodiments of the present invention, the plastic package is applied such that one part of the interposer (the part in connection with the CMOS chip) is covered by the plastic package, while another part (the part in connection with the pressure sensor) is not, and thus remains exposed to the fluid, thereby solving the problem of corrosion.

This is a first underlying idea of the present invention, which avoids the need for non-standard processing steps of the CMOS chip.

It is noted that such an interposer is relatively easy to produce using standard technology, as will be described further in relation to FIG. 8 and FIG. 9.

But the inventors went one step further, and they also found a way to make the assembly more compact, by arranging one or more of the sensor, interposer and CMOS chip over/under each other in height direction, without exposing the CMOS chip to the exhaust gas, because it is encapsulated by the plastic package. It is counter-intuitive that by "adding" and "inserting" an interconnection module between the pressure sensor on the one hand and the CMOS chip on the other hand, rather than a direct electrical connection between the pressure sensor and the CMOS chip, that the assembly can be made more compact. They also go against the general idea that the CMOS chip must not be located in or under the cavity that is exposed to exhaust gas or corrosive gas, because it actually can. In fact, in one embodiment, the inventors came to the idea of stacking the pressure sensor, and the interposer and the CMOS chip on top of each other, thereby achieving ultimate compactness.

Before describing actual embodiments of a pressure sensor assembly according to the present invention, the individual components: a discrete sensor device, an interposer and a CMOS chip used therein, will be briefly described next.

FIG. 4 and FIG. 5 are a schematic representation (in side view and top view) of an exemplary discrete absolute pressure sensor 10 as can be used in embodiments of the present invention. In fact, only very few details of the absolute pressure sensor 10 are shown: a substrate 12 having a thinned portion forming a membrane 13 (also known as diaphragm) and contact pads 11 connected with a pressure sensitive circuit (not shown) located on the membrane 13. The pressure sensitive circuit may comprise four piezo-resistors arranged in a Wheatstone-bridge, but another pressure sensitive circuit could also be used. Pressure sensors of the type described above (having a membrane and a piezo-resistive structure) are well known in the art, and hence need not be further described here.

In fact, any pressure sensor can be used, provided that it is adequately protected for exposure to the fluid, e.g. exhaust gas. Such protection may for example include, the present invention not being limited thereto, (a) the membrane being covered by a protective layer such as e.g. silicon nitride, and (b) the electrical contact(s) 11, e.g. made of aluminum, being covered with gold, with a diffusion prevention layer such as e.g. TiW in between. The absolute pressure sensor 10 shown in FIG. 5 has four contact pads 11, but the present invention is not limited to pressure sensors having only four contact pads, and pressure sensors having more than four, or less than four contact pads 11 may also be used. In the example shown in FIG. 5, the contact pads 11 are linearly aligned, but that is not necessary for the present invention, and other positions can also be used.

FIG. 6 and FIG. 7 are a schematic representation (in side view and top view) of an exemplary discrete relative or differential pressure sensor 20 as can be used in embodiments of the present invention, but embodiments of the present invention are not limited to this specific example. Everything mentioned above for the absolute pressure sensor 10 is also applicable for the relative pressure sensor 20, except that the cavity 24 underneath the membrane 23 of the relative pressure sensor 20 is accessible from the backside, whereas the cavity 14 of the absolute pressure sensor 10 is not accessible from the backside. Embodiments of assemblies according to the present invention can work with absolute pressure sensors 10 like the one shown in FIG. 4 and FIG. 5, or with relative pressure sensors 20 like the one shown in FIG. 6 and FIG. 7, but may also work with other pressure sensors.

FIG. 8 and FIG. 9 are a schematic representation (in side view and top view) of an exemplary "interconnection module" 30, also referred to herein as "interposer", as can be used in embodiments of an assembly according to the present invention, but the present invention is not limited to the specific example shown.

The interposer 30 shown in FIG. 8 and FIG. 9 comprises a substrate 31 (further referred to herein as "second substrate" of the assembly). The substrate can be an electrically conductive or semi-conductive substrate (e.g. silicon), in which case an electrically insulating layer 32 is put on top (e.g. thermally grown silicon oxide). Alternatively an electrically insulating material is used as the substrate, for example glass, alumina, duroplast, etc. In both cases the top surface is non-conductive.

On top of the non-conductive layer, a plurality of (for example four) conductive paths 33 are provided, but interposers with less than four or more than four conductive paths are also possible. Each path 33 has a first pad 34, for example at a first end thereof, and a second pad 35, for example at a second end thereof, opposite the first end.

As mentioned above, the conductive path 33 and the pads 34, 35 are made of a corrosion resistant material. It is important that the tracks do not contain materials such as aluminum or copper, or only in a very small amount such as e.g. less than 1 weight % of the tracks, preferably less than 0.1 weight % of the track material.

Such tracks have a high corrosion resistance, and thus can be exposed to the exhaust gas. Since preferably they are substantially entirely made of non-corrosive metals, any pores or cracks or crevices which may occur in the conductive tracks, will not cause or accelerate corrosion of the tracks.

A first exemplary interconnection module 30 may be produced as follows:
  a) providing a ceramic substrate 31, for example glass or alumina;
  b) applying a Ti or Ti—W layer on the substrate 31, for example by sputtering;
  c) patterning the Ti or Ti—W layer for defining a plurality of tracks 33, each track having a first bondpad 34 and a second bondpad 35, located for example but not necessarily at opposite ends of the tracks 33;
  d) depositing Au on top of the Ti or Ti—W tracks, for example by electrolysis.

A second exemplary interconnection module 30 may be produced as follows:
  a) providing a ceramic substrate 31, for example glass or alumina;
  b) applying a Ta layer on the substrate 31, for example by sputtering;
  c) patterning the Ta layer for defining a plurality of tracks 33, each track having a first bondpad 34 and a second bondpad 35, located for example but not necessarily at opposite ends of the tracks 33;
  d) depositing Pt on top of the Ta tracks, for example by sputtering.

But the invention is not limited to these specific examples of interconnection modules 30, and the invention would also work with other interconnection modules 30 that can withstand the harsh environment of exhaust gas (on at least one side thereof), and can be electrically interconnected to standard CMOS chip (on the other hand).

Advantageously, as will be explained further, the size of the interconnection module can be very small, e.g. smaller than the size of the sensor chip (in terms of area in cross section in a plane parallel to the first substrate), or smaller than the size of the CMOS-chip, or smaller than both of them. Therefore many interconnection modules can be made in parallel starting from a single (second) substrate. Moreover, the tracks need to extend over the entire length of the interconnection module, but only over a fraction thereof, e.g. over less than 30% (see for example FIG. 23). The smaller the length of the tracks, the less noble metal (e.g. gold or platinum) is required, and the lower the material cost. This is extremely important in a highly competitive environment such as automotive, where every penny counts.

FIG. 10 and FIG. 11 are a schematic representation (in side view and top view) of an exemplary CMOS chip. The CMOS chip can be any integrated semiconductor device, e.g. pure analog, or mixed analog and digital, or pure digital. The CMOS chip may comprise a programmable processor with a non-volatile memory, etc. But the functionality of the CMOS chip, or the technology in which the CMOS chip is made is not the main focus of the present invention, apart from the fact that the CMOS chip may contain aluminum and/or copper on its surface. Therefore only minor details of the CMOS chip are shown in FIG. 10 and FIG. 11, namely: a semiconductor substrate 40 and bondpads 41. The latter are typically made of aluminum, hence, would corrode if exposed to the exhaust gas of automobile vehicles without protection.

FIG. 12 shows a first embodiment of an assembly 1200 according to the present invention, in side view. In this embodiment, the discrete pressure sensor 1210 is an absolute pressure sensor.

As can be seen, the discrete pressure sensor 1210, the interposer 1230 and the CMOS chip 1240 are arranged above or on top of a (first) substrate 1254, which can be a Cu lead frame, but the invention is not limited thereto, and another substrate 1254 can also be used, for example a laminate or printed circuit board (PCB). The components 1210, 1230, 1240 (and optionally further components, which are not shown) can be mounted to the substrate 1254 in known manners, e.g. by soldering and/or by using adhesive (not shown). They are arranged substantially next to each other, but not necessarily on the same height.

The contact pads 1211 of the pressure sensor 1210 are connected via first bonding wires 1251 to first contacts 1234 of conductive tracks on the interposer 1230. The first bonding wires 1251 are preferably made of gold or platinum or alloys containing only gold and platinum. The second contact pads 1235 of the interposer 1230 are connected via second bonding wires 1252 to first contact pads 1241 of the CMOS chip. The second bonding wires 1252 can for example be made of gold, platinum, aluminum, silver, copper, or any other material suitable for bonding, because the second bonding wires are not exposed to the exhaust gas. Optionally second contacts 1242 of the CMOS chip 1240 are connected to a lead frame 1254 by means of third bonding wires 1253, which can for example also be made of gold, platinum, aluminum, silver or copper.

According to an important aspect of the present invention, the CMOS chip, and the contact 1241 of the CMOS chip, and the second bonding wire 1252 and the second contact 1235 of the interposer 1230 are encapsulated or overmoulded by a plastic package 1243, where the plastic is a corrosion resistant plastic. This has the advantage of protecting in particular the CMOS chip, the first contact 1241, the bonding wire 1252, and the optional bonding wire 1253 against corrosion caused by exposure to the exhaust gas, even if the contact 1241 of the CMOS chip is made of aluminum, and without requiring this contact to be covered with a TiW and/or gold layer. Hence, no special protection needs to be provided to the CMOS chip itself, which is a major advantage. Furthermore, the plastic package 1243 provides good mechanical integrity to the structure. Of course other components, for example passive components such as e.g. capacitors can also be located in the overmolded section.

The arrow "Pfluid" is a schematic indication of the pressure of the fluid that may contain corrosive components. As can be seen, the following elements are exposed to the fluid: the pressure sensor 1210 (which is protected by one or more protective layers such as e.g. SiN), the contact 1211 (which is protected by one or more protective metals or alloys such as e.g. TiW and gold), the first bonding wire 1251 (which is typically made of gold or platinum or an alloy containing only gold and platinum), the non-conductive upper surface 1232 of the interposer (e.g. Si-oxide), the first contact pad 1234 of the interposer, and typically also a part of the tracks 1233 of the interposer 1230 which is not completely over-moulded. This structure is highly resistant to corrosion for the reasons explained above. An important advantage over the "interconnection terminals 10" shown in FIG. 3 is that the tracks 1233 do not contain corrosive metal, such as aluminum or copper. Hence, even if cracks or crevices would occur, these will not cause or accelerate corrosion of the structure. The assembly 1200 of FIG. 12 has only one cavity 1244. The CMOS chip 1240 is not located in a cavity, but is completely covered by a plastic molding.

Figure 13:
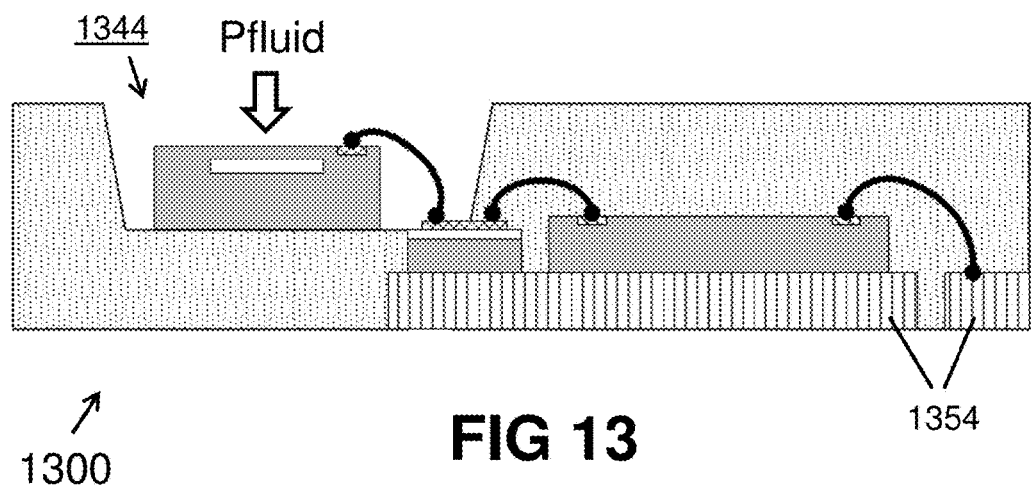
FIG. 13 shows another embodiment of an assembly according to the present invention. This embodiment can be seen as a variant of the embodiment of FIG. 12 having a shorter lead frame.

FIG. 13 shows another embodiment of an assembly 1300 according to the present invention. This embodiment can be seen as a variant of the embodiment 1200 of FIG. 12 wherein the lead frame 1354 is shorter than the lead frame 1254, and offers the same advantages. The assembly 1300 of FIG. 13 has only one cavity 1344.

Figure 15:
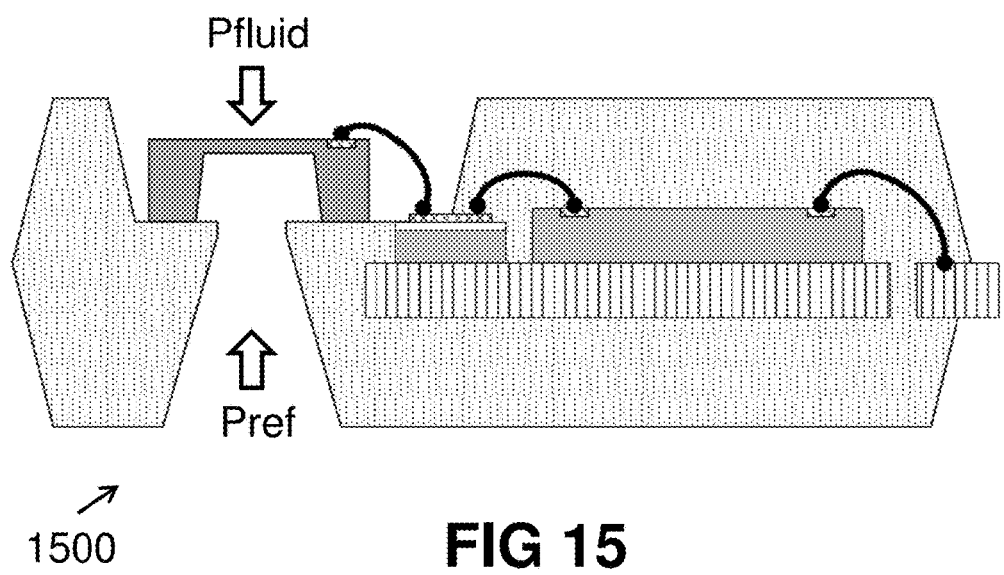
FIG. 15 shows another embodiment of an assembly according to the present invention. This embodiment can be seen as a variant of FIG. 14 having a SO-like package but with an opening on either side.

In a variant of the embodiment of FIG. 12 or FIG. 13 (not shown), plastic package is also applied underneath the lead frame 1254, 1354, e.g. in a manner similar to the right hand side of FIG. 15.

In another variant of FIG. 12 (not shown), the assembly may comprise at least two pressure sensors, for example two absolute pressure sensors, e.g. for redundancy reasons. In this case preferably a single interposer but with the double amount of tracks could be used (for example eight tracks instead of four tracks), and a single CMOS chip could be used having twice as many first pads. Alternatively, two separate CMOS chips could be used.

In yet another variant of FIG. 12 (not shown), the assembly could have two pressure sensors, and the CMOS chip could have only six first pads, and the interposer could have only six tracks, but two of the tracks (e.g. for providing a supply voltage and ground voltage to the pressure sensors) could be shared between the two pressure sensors.

Figure 14:
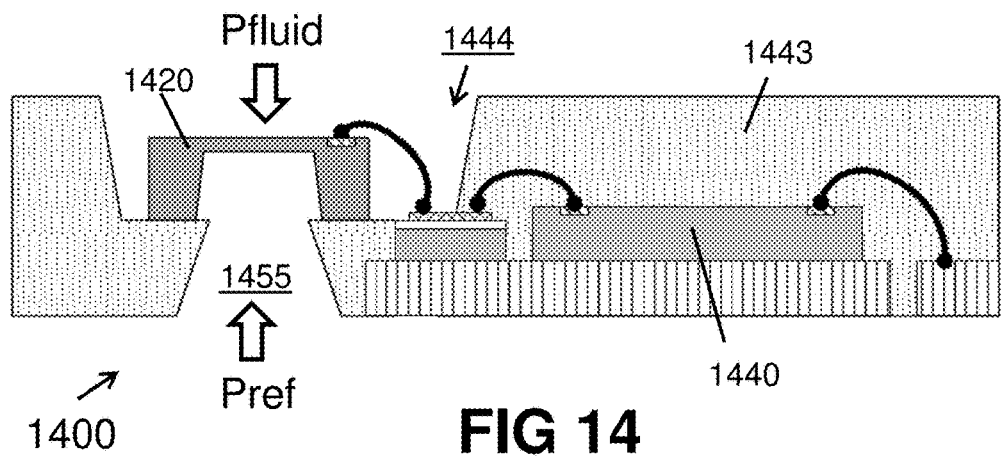
FIG. 14 shows another embodiment of an assembly according to the present invention. This embodiment can be seen as a variant of FIG. 13 having a relative pressure sensor.

FIG. 14 shows another embodiment of an assembly 1400 according to the present invention. This embodiment can be seen as a variant of FIG. 13, containing a relative pressure sensor 1420 instead of an absolute pressure sensor. In this case, an opening 1455 is provided in the plastic package 1443 for allowing a lower side of the pressure sensor 1420 to be in fluid communication with a reference pressure, e.g. atmospheric pressure (indicated by arrow "Pref"). Of course, the assembly 1400 should be arranged such that the corrosive fluid only has access to the first cavity 1444 on the upper side of the pressure sensor 1420 and not to the opening 1455, which can be achieved for example by mounting the assembly 1400 to a wall (not section), or in other suitable manners known by the skilled person. The assembly 1400 of FIG. 14 has two cavities or openings, located on opposite sides of the assembly 1400, more in particular, on opposite sides of the sensor chip 1420. The CMOS chip 1440 is not located in a cavity, but is completely covered by a plastic molding.

FIG. 15 shows another embodiment of an assembly 1500 according to the present invention. This embodiment can be seen as a variant of FIG. 14 having a SO type of package where the reference pressure "Pref" may also contain exhaust gas as no corrodible metals are accessible from the reference side "Pref".

Figure 16:
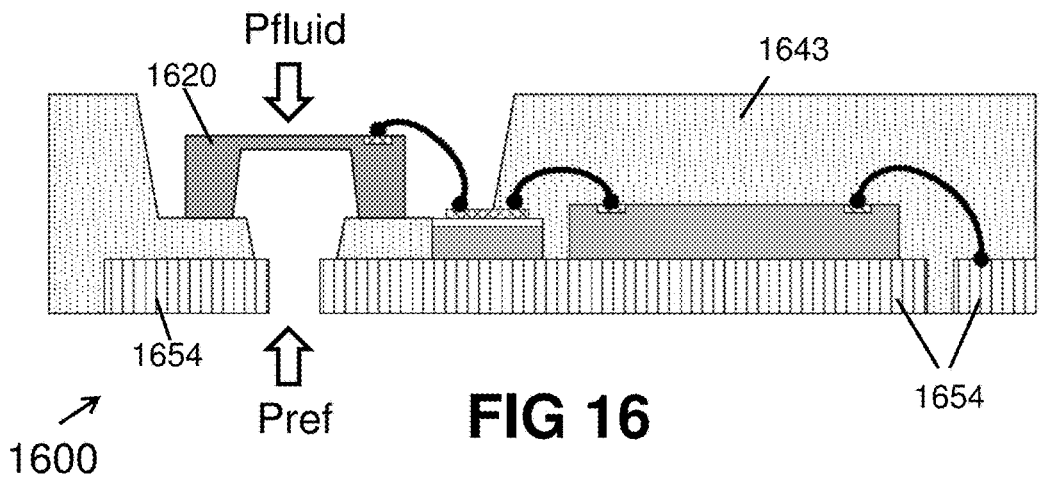
FIG. 16 shows another embodiment of an assembly according to the present invention. This embodiment can be seen as a variant of FIG. 14 with a longer lead frame.

FIG. 16 shows another embodiment of an assembly 1600 according to the present invention. This embodiment can be seen as a variant of FIG. 14 having a longer lead frame 1654. As can be seen, in this case both the plastic package 1643 as well as the lead frame 1654 would have an opening for allowing fluid connection of a lower side of the pressure sensor 1620 to a reference fluid having a reference pressure "Pref".

FIG. 17 shows another embodiment of an assembly 1700 according to the present invention. This embodiment can be seen as a variant of the embodiment of FIG. 12, wherein the interposer 1730 has an increased length, and wherein the absolute pressure sensor 1710 is mounted on top of the interposer 1730.

Preferably, the second substrate is chosen of a material that has the same or about the same thermal expansion as the sensor chip. By choosing such a material, and by placing the sensor on top of the interposer rather than on the leadframe, package stress on the sensor chip can be reduced.

As can be seen in FIG. 17, even though the size of the interposer substrate is increased, the length L of the tracks 1733, made of for example gold or platinum, can remain unchanged, which is important for cost reasons. The price of the substrate of the interposer 1730 is less significant. The assembly 1700 of FIG. 17 has only one cavity 1744.

FIG. 18 shows another embodiment of an assembly 1800 according to the present invention. This embodiment can be seen as a variant of the embodiment of FIG. 17, but with a relative pressure sensor 1820 instead of an absolute pressure sensor. In this case the substrate of the interposer 1830 has an opening 1836, and the lead frame 1854 also has an opening 1856, both openings being in fluid communication with each other and with a reference pressure "Pref" during actual use. The assembly 1800 of FIG. 18 has two cavities or openings, located on opposite sides of the assembly 1400, more in particular on opposite sides of the sensor chip. The CMOS chip 1840 is not located in a cavity, but is completely covered by a plastic molding.

Figure 19:
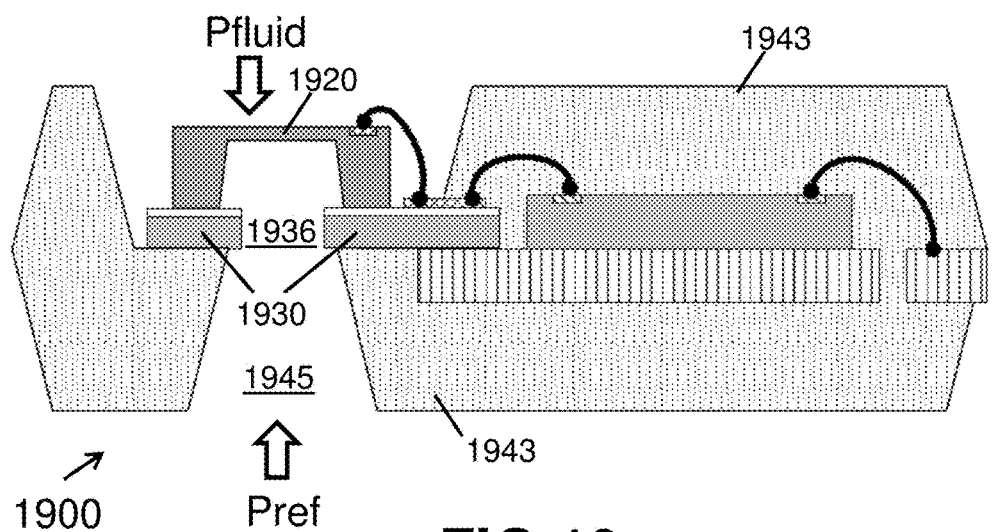
FIG. 19 shows another embodiment of an assembly according to the present invention. This embodiment can be seen as a variant of the embodiment of FIG. 15, wherein the pressure sensor is mounted on the interposer and the interposer has an opening.

FIG. 19 shows another embodiment of an assembly 1900 according to the present invention. This embodiment can be seen as a variant of the embodiment of FIG. 15, wherein the pressure sensor 1920 is mounted on top of the interposer 1930, and wherein the interposer 1930 has an increased length for supporting the pressure sensor 1920, and wherein the interposer 1930 has an opening 1936, and the plastic package 1943 has a second cavity 1945 for providing a fluid interconnection between a lower side of the pressure sensor 1920 and the reference pressure "Pref".

Advantageously this embodiment provides a relative sensor exposable to two harsh environments, without exposing the lead frame.

Figure 20:
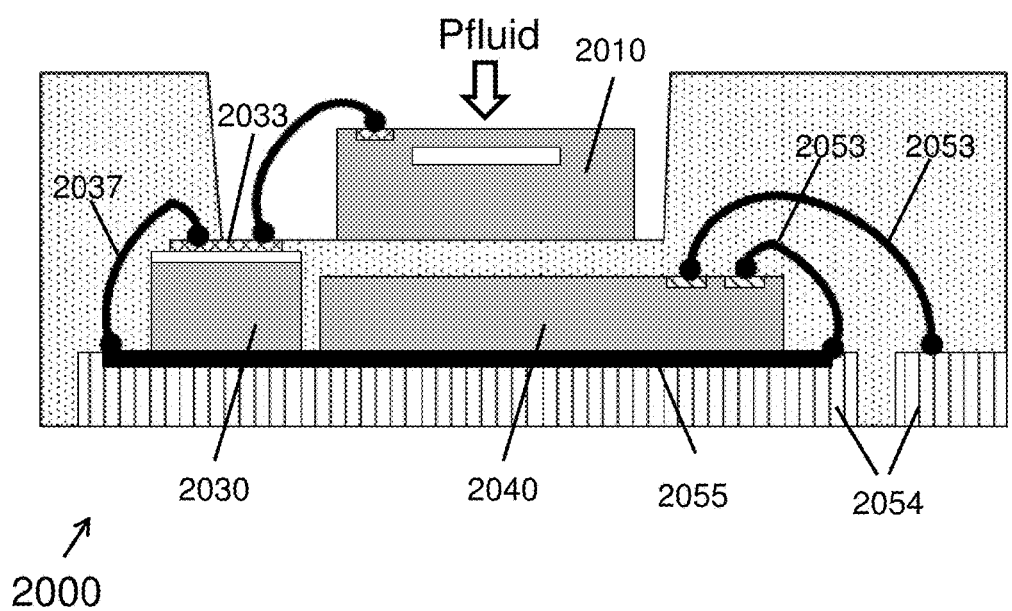
FIG. 20 shows another embodiment of an assembly according to the present invention. In this embodiment the interposer and the CMOS chip are arranged on top of the lead frame next to each other, and the pressure sensor is arranged above the overmoulded CMOS chip.

FIG. 20 shows another embodiment of an assembly 2000 according to the present invention. In this embodiment the interposer 2030 and the CMOS chip 2040 are arranged on top of the lead frame 2054 and next to each other. The pressure sensor 2010 is arranged on top of the overmoulded CMOS chip 2040. It is noted that the tracks 2033 of the interposer 2030 are not directly connected to the CMOS chip 2040, but indirectly via the lead frame 2054 (not explicitly shown). The lead frame 2054 can in this case for example be a laminate or a PCB (e.g. a single layer or two-layer or four-layer or six-layer or eight layer PCB) with standard metal tracks 2055 that is connected by bondwires 2053 to the CMOS circuit and with bondwires 2037 to the encapsulated part of the interposer 2030.

Figure 21:
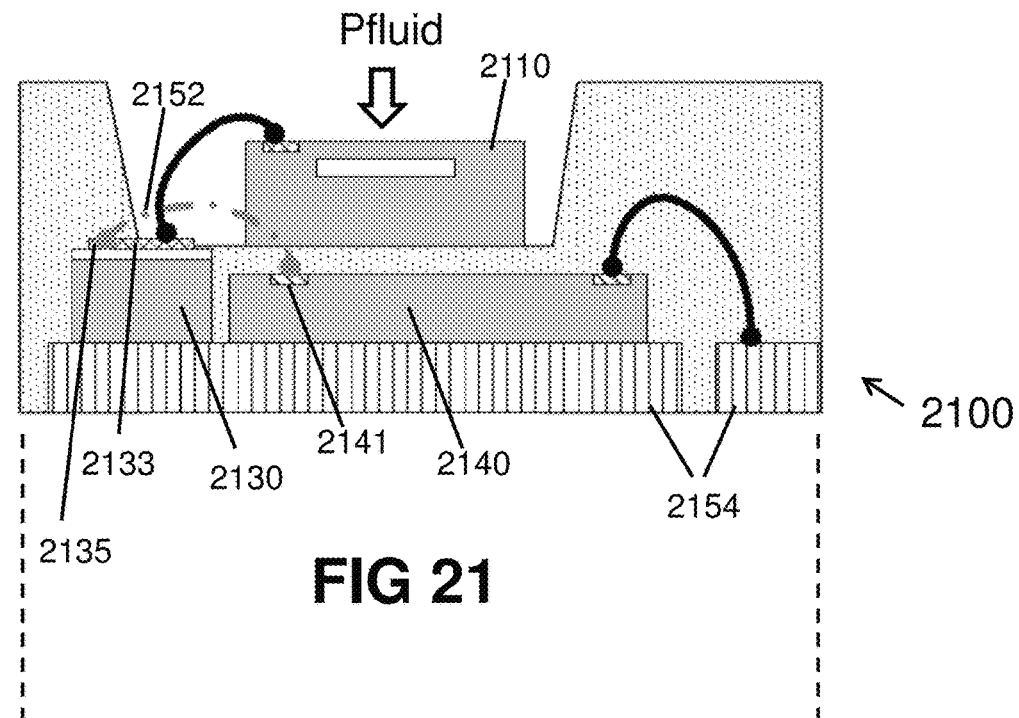
FIG. 21 and FIG. 22 show another embodiment of an assembly according to the present invention, in side view and top view respectively. In this embodiment the interposer and the CMOS chip are mounted on a lead frame next to each other, and the pressure sensor is mounted on top of the overmoulded CMOS chip.
Figure 22:
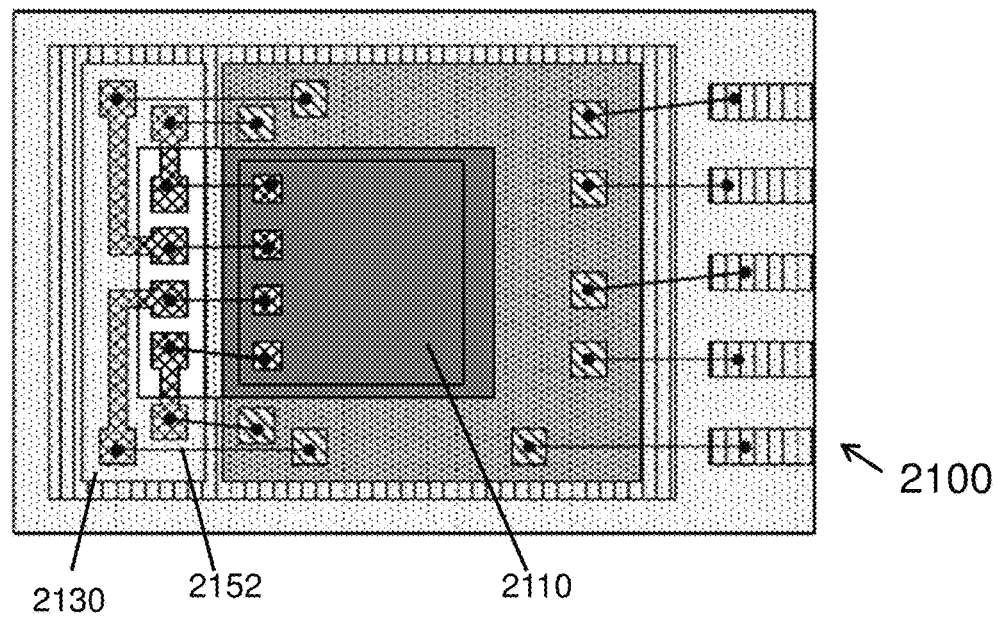

FIG. 21 and FIG. 22 shows another embodiment of an assembly 2100 according to the present invention in side view and top view respectively. This embodiment can be seen as a variant of FIG. 20, wherein the pressure sensor 2110 is also mounted on top of the CMOS chip 2140, but where the second pads 2135 of the interposer 2130 and the first pads 2141 of the CMOS chip 2140 are directly connected via bonding wires 2152, not via the substrate (e.g. lead frame) 2154. The bonding wires are not physically touching, but are offset in the depth direction of FIG. 21, as can be appreciated from FIG. 22.

It is noted that in this case the tracks 2133 of the interposer 2130 can also be connected indirectly via the lead frame 2154 (not explicitly shown). The lead frame can also be replaced by a PCB with standard metal tracks that is connected by bondwires to the CMOS circuit and with bondwires to the encapsulated part of the interposer chip.

Figure 23:
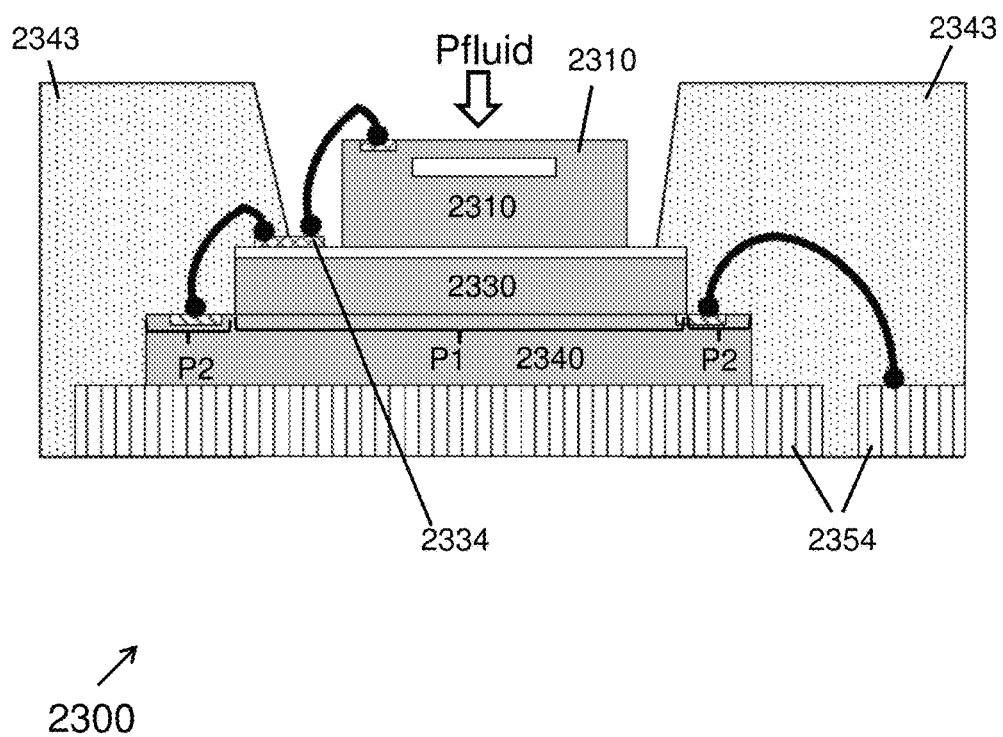
FIG. 23 shows another embodiment of an assembly according to the present invention. In this embodiment the discrete pressure sensor is mounted on top of the interposer, which is mounted on top of the CMOS chip, which is mounted on a lead frame.

FIG. 23 shows another embodiment of an assembly 2300 according to the present invention. As can be seen, in this embodiment the pressure sensor 2310 is stacked on top of the interposer 2330, which in turn is stacked on top of the CMOS chip 2340, resulting an extremely compact solution. The outer dimensions of the assembly can for example be smaller than 5 mm×10 mm×8 mm, or even smaller than 2.4 mm×5.0 mm×4.0 mm, for example smaller than 2.0 mm×3.0 mm×3.0 mm, or even smaller than 1.5 mm×2.0 mm×2.0 mm. Most of the same principles mentioned above are also applicable here, especially in terms of materials, but there is one difference: since the interposer 2330 is mounted on top of the CMOS chip 2340, the part P1 of the CMOS chip which is overlaid by the interposer 2330 is already shielded or protected by the interposer 2330, and hence only the parts P2 which are not overlaid by the interposer 2330 need to be protected by the plastic package 2343. In other words, in this embodiment the interposer 2330 has the additional function of physically protecting the CMOS chip against corrosion. Due to its compactness, the lead frame package can be made smaller, and thus cheaper.

As can be seen, the interposer chip on top of the CMOS chip is of a comparable size (seen from above), or stated more exactly, a ratio of the area of the interposer and the CMOS chip is preferably a value in the range from 70% to 100%, for example in the range from 70% to 90%.

When the sandwich-structure comprising the CMOS chip and the interposer is subjected to bending stress, stress will appear mainly at the top of the interposer and the bottom of the CMOS chip. Since the assembly or package with a lead frame 2354 at the bottom and a mould compound mainly at the side is very much asymmetric, it can be expected that most of the stress is related to bending. When the surface of the CMOS chip is substantially in the middle of this sandwich, the stress on the CMOS chip surface will be very small and therefore the influence of packaging stress on the CMOS chip will be much better than a version where the pressure sensor is placed directly on top of the CMOS chip.

Moreover, if the interposer is attached to the CMOS chip, not only at its outer ends, but over its entire surface, for example by means of an adhesive, the stiffness of the structure against bending is significantly increased. Indeed, as is known in the art of mechanics, but normally not considered in the field of micro-electronics, the moment of inertia of a "beam" is proportional to the third power of its height, meaning that, if the CMOS chip and the interposer would have the same width "B" and height "H", the moment of inertia of the structure where the CMOS chip and the interposer are loosely stacked on top of each other, is proportional to $2 \cdot B \cdot H^3$, but when the interposer and the CMOS chip are attached to each other, the moment of inertia is proposal to $B \cdot (2H)^3 = 8 \cdot B \cdot H^3$, that is a factor of four higher. Suitable ways of attaching the interposer and the CMOS chip are for example by using an adhesive.

Or stated in other words, the addition of the interposer shifts the stress at the surface of the CMOS chip towards the bottom surface of the CMOS chip (which is not a problem) and to the upper surface of the interposer (which is not a problem either), and thus can be used to reduce or even eliminate influences of mechanical stress on the CMOS chip.

But of course, the height of the interposer does not need to be the same as the height of the CMOS chip. The height (or thickness) of the CMOS is typically a value in the range from 100 to 700 micron, such as for example about 300 or about 400 micron. The height (or thickness) of the interposer is typically a value in the range from 100 to 700 micron, such as for example about 300 or about 400 micron. Preferably the sum of the height of the CMOS chip and the height of the interposer is a value in the range from 400 to 1000 micron.

FIG. 23 shows an embodiment with an absolute pressure sensor with CTE matching, a sensor base, and a relatively large interposer (larger than the sensor area), and with a lead frame interconnect. The interposer is mounted on top of the CMOS chip or ASIC, no portion of which is exposed to the harsh environment. The interposer serves both as an electrical interconnection and as a mechanical support for the sensor chip.

FIG. 23 shows a configuration where the film assisted moulding with an insert for a cavity 2344 is easy to implement. The whole insert rests on the interposer during moulding. In this embodiment the interposer can be enlarged to facilitate the fabrication of a cavity with film assisted moulding. For film assisted moulding one applies a film between the mould chase and the lead frame so that the mould is between the leadframe and the film. Then the film makes sure that the chase is not in direct hard contact with the lead frame and it keeps the chase clean. Corners of inserts will be rounded by this tape and due to the flexibility of the film height tolerances of the leadframe and devices can be relaxed.

Figure 24:
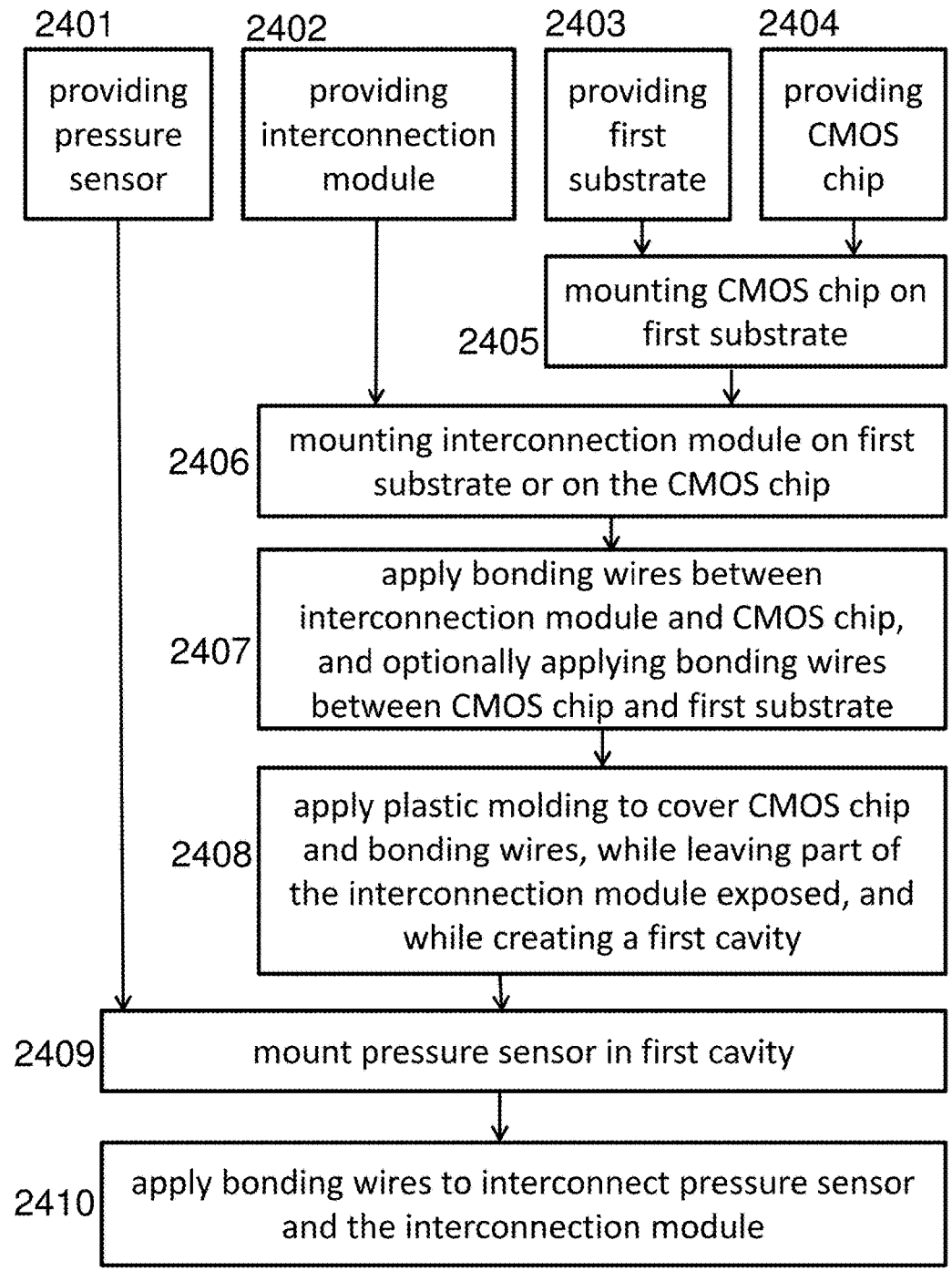
FIG. 24 illustrates a method according to the present invention.

FIG. 24 shows a method of manufacturing an assembly according to embodiments of the present invention. Reference numbers refer only to the structure of FIG. 12 (to keep the description simple), but the method is of course also applicable to the structures shown in the other Figures). The method comprises the following steps:
- a) providing 2403 the first substrate 1254;
- b) providing 2401 the pressure sensor 1210;
- c) providing 2402 the interconnection module 1230;
- d) providing 2404 the CMOS chip 1240;
- e) mounting 2405 the CMOS chip 1240 on the first substrate 1254, for example using soldering or using an adhesive;
- f) mounting 2406 the interconnection module 1230 on the first substrate 1254 or on the CMOS chip 1240, for example using an adhesive;
- g) applying 2407 second bonding wires 1252 to interconnect the second pads 1235 of the interconnection module 1230 and the first pads 1241 of the CMOS chip 1240, and
- h) optionally applying third bonding wires 1253 to interconnect second pads 1242 of the CMOS chip 1240 and the first substrate 1254;
- i) applying 2408 a plastic package 1243 to cover or encapsulate at least the CMOS chip 1240, and the first pads 1241 of the CMOS chip, and the second bonding wires 1252, and the second pads 1235 of the interconnection module 1230 by a corrosion-resistant plastic, in such a way as to leave the first pads 1234 of the interconnection module 1230 exposed, and in such a way as to form a cavity 1244 sufficiently large to accommodate the pressure sensor 1210;
- j) mounting 2409 the pressure sensor 1210 in the cavity 1244 to the first substrate 1254 or to the plastic package 1243 or to the interconnection module 1230, for example using an adhesive;
- k) applying 2410 first bonding wires 1251 to interconnect the first pads 1211 of the pressure sensor 1210 and the first pads 1234 of the interconnection module 1230.

It is noted that the bonding of step g) and the optional bonding of step h) can be performed in a single bonding step.

Figure 25:
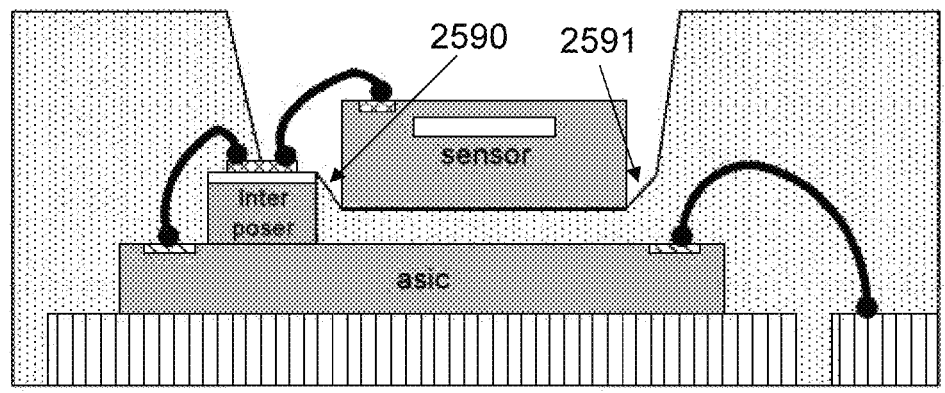
FIG. 25 to FIG. 28 show additional embodiments of an assembly according to the present invention.

FIG. 25 shows an embodiment with an absolute pressure sensor, with an interposer and lead frame interconnect. Again, no portion of the CMOS chip or CMOS chip surface is exposed to the harsh environment. The step or inclination 2590, 2591 in the mould at the interposer is defined by the flexibility of the film used at molding, for example a thin teflon film having a thickness of about 20 to 100 micron. The more flexible the film, the steeper the step can be, the smaller the size of the assembly can be.

FIG. 25 shows a version where film assisted cavity moulding is used and where the insert in the mould chase presses the film on the interposer so that the film is pressed together here. The level of the mould compound next to the interposer is therefore typically about 50 to 100 um lower. So, with the thickness of the interposer, the thickness of the mould compound above the CMOS chip can be controlled.

In this way, problems related to forces exerted by the pick and place machine, for example braking the sensor chip or braking the CMOS chip when mounting the sensor chip to the partial assembly, can be reduced or even eliminated, by using the interposer to define the stop position.

Figure 26:
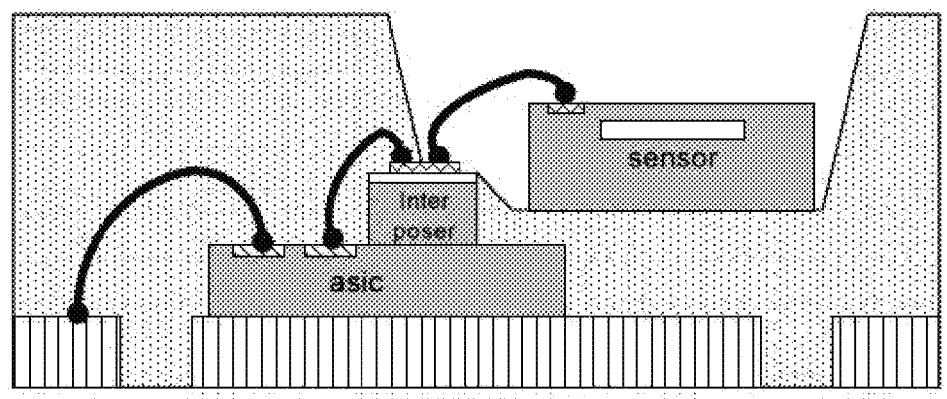

FIG. 26 is a variant of FIG. 25, and shows an embodiment with an absolute pressure sensor, with an interposer and lead frame interconnect. Again, no portion of the CMOS chip or CMOS chip surface is exposed to the harsh environment. As for FIG. 25, the step or inclination in the mould is defined by the flexibility of the film used at molding. FIG. 26 an example where the CMOS chip does not support the sensor chip.

It is clear that the interposer of FIG. 25 and FIG. 26 cannot be part of the substrate, for example of the lead frame. It is an advantage that the vertical position of the tracks on the interposer are located between the vertical position of the bondpads of the CMOS chip and the vertical position of the bondpads of the sensor chip.

Figure 27:
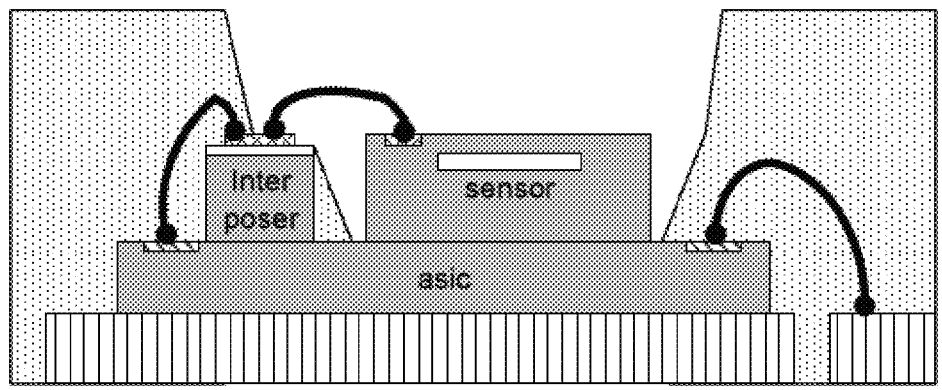

FIG. 27 shows another embodiment with an absolute pressure sensor with CTE matching sensor base and small interposer and leadframe interconnect. A portion of the CMOS chip surface or CMOS chip surface is exposed to the harsh environment.

FIG. 27 shows an implementation which is more difficult to achieve as the insert of the mould chase with the film has to press on the CMOS chip and the interposer. This embodiment does not provide protection of the entire surface of the CMOS chip by a moulding compound.

Figure 28:
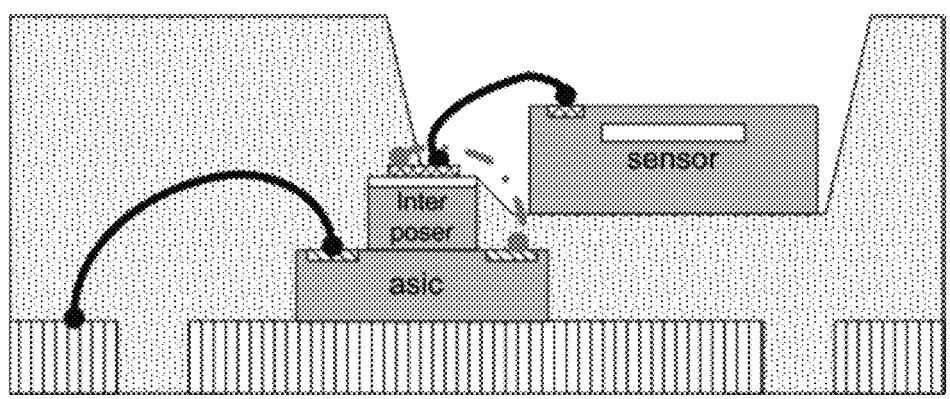

FIG. 28 can be seen as a variant of FIG. 26 or as a variant of FIG. 27. The interposer can be smaller than the smallest of the CMOS chip and the sensor chip.

In the embodiments of FIGS. 25, 26 and 28, the interposer is preferably smaller than the CMOS chip and placed on top of the CMOS chip. It serves as stopper for the moulding insert of the film assisted moulding tool that creates the cavity for the pressure sensor. The height of the interposer defined the thickness of the mould above the CMOS chip that protects the CMOS chip surface. With this configuration one creates a chip scale package which is not much larger than the CMOS chip and where the entire CMOS chip surface is encapsulated by mould compound and where one still has a good thermal matching between the sensor and the CMOS chip.

The embodiments of FIGS. 25, 26 and 28 show a small assembly where the interposer is placed on top, e.g. directly on top of the CMOS chip and serves as spacer for the cavity moulding so that the wirebonds between CMOS chip and interposer are encapsulated as well as the entire CMOS chip surface, and wherein the sensor is mounted above the CMOS chip for good thermal matching with the CMOS chip.

As explained above, in several embodiments of the present invention, the interconnection module has an area (parallel to the substrate) smaller than the area of the sensor chip or smaller than the area of the CMOS chip, or smaller than both the area of the sensor chip and the CMOS chip. This is possible because in such embodiments the interconnection module only needs to provide an electrical interface between the harsh environment and the protected environment, but does not need to provide a support for the sensor chip and/or for the CMOS chip.

In several embodiments of the present invention, the interconnection module is located in height direction of the assembly (perpendicular to the first substrate) between or at least partially between the first substrate (e.g. lead frame) and the sensor chip (see e.g. FIG. 12 to FIG. 23 and FIG. 25, FIG. 26 and FIG. 28), or can be located at substantially the same height as the sensor chip (see e.g. FIG. 27). The interconnection module can be adjacent the CMOS chip (see e.g. FIG. 12 to FIG. 22), preferably at a distance from 30 to 300 micron, e.g. from 50 to 250 micron, for example 50 to 200 micron, for example 50 to 150 micron, for example 50 to 100 micron, or can be on top of the CMOS chip (see e.g. FIG. 23). The sensor chip can be located adjacent in lateral direction but higher than the interconnection module (see e.g. FIG. 12 to FIG. 16 and FIG. 20 to FIG. 22), or on top of the interconnection module (see e.g. FIG. 17 to FIG. 19 and FIG. 23). In all embodiments, the length of the conductive traces of the interconnection module is preferably as short as possible, for example smaller than 800 micron, e.g. less than 600 micron, e.g. less than 500 micron, e.g. less than 400 micron, e.g. less than 300 micron, in order to reduce the material cost of the interposer, e.g. the gold or platinum tracks, and/or to make a compact assembly, and preferably both compact and with a reduced material cost.

The invention claimed is:

1. A semiconductor pressure sensor assembly suitable for use under an exhaust gas environment of an automobile engine for measuring a pressure of the exhaust gas which contains corrosive components, the pressure sensor assembly comprising:

a first cavity comprising an opening for allowing exposure to said exhaust gas;

a pressure sensor arranged in said cavity, the pressure sensor comprising a plurality of first bondpads made of or covered by a first corrosion resistant material;

a CMOS chip mounted on a first substrate, the CMOS chip comprising a plurality of first bondpads without corrosion resistant material on top;

an interconnection module comprising a second substrate and a plurality of electrically conductive paths made of a second corrosion resistant material, each of the conductive paths having a first bondpad and a second bondpad;

the first bondpads of the pressure sensor being connected via first bonding wires to the first bondpads of the interconnection module, the first bonding wires being made of a third corrosion resistant material;

the first bondpads of the CMOS chip being connected via second bonding wires to the second bondpads of the interconnection module;

wherein the electrically conductive paths of the interconnection module provide electrical connection between the pressure sensor and the CMOS chip, the CMOS chip, the first bondpads of the CMOS chip, the second bondpads of the interconnection module, and the second bonding wires, and part of the interconnection module are protected from exposure to said exhaust gas by encapsulation with a corrosion resistant plastic material, and the first bondpads of the interconnection module are not protected from said exposure to said exhaust gas by encapsulation with said corrosion resistant plastic material.

2. A semiconductor pressure sensor assembly according to claim 1, wherein the interconnection module is smaller than the pressure sensor.

3. A semiconductor pressure sensor assembly according to claim 1, wherein the first substrate is a lead frame.

4. A semiconductor pressure sensor assembly according to claim 1, wherein the first corrosion resistant material is Au or Pt, or an alloy consisting of a mixture of Au and Pt, or is an alloy containing at least Au or Pt;

and/or wherein the third corrosion resistant material is Au or Pt, or an alloy consisting of a mixture of Au and Pt.

5. A semiconductor pressure sensor assembly according to claim 1, wherein the second corrosion resistant material is a metal different from aluminum and different from copper, or wherein the second corrosion resistant material is a metal alloy containing less than 5 atom % aluminum;

or wherein the second corrosion resistant material is a metal alloy containing less than 5 weight % aluminum;

or wherein the second corrosion resistant material is a metal alloy containing less than 5 atom % copper;

or wherein the second corrosion resistant material is a metal alloy containing less than 5 weight % copper.

6. A semiconductor pressure sensor assembly according to claim 1, wherein the second corrosion resistant material is a single metal selected from a group consisting of Au, Pt, Pd, Ta, Ti, W, Ag, Mo; or wherein the second corrosion resistant material is a metal alloy comprising at least one metal selected from a group consisting of Au, Pt, Pd, Ta, Ti, W, Ag, Mo; or wherein the second corrosion resistant material is a metal alloy comprising at least two metals selected from a group consisting of Au, Pt, Pd, Ta, Ti, W, Ag, Mo; or wherein the second corrosion resistant material is a Ni—Pd—Au stack.

7. A semiconductor pressure sensor assembly according to claim 1,
wherein the interconnection module is arranged next to the CMOS chip, and
wherein the pressure sensor is located at least partly above or on top of one or both of the CMOS chip and the interconnection module.

8. A semiconductor pressure sensor assembly according to claim 1,
wherein the interconnection module is mounted above or on top of the CMOS chip thereby defining a first portion of the CMOS chip which is overlaid by the interconnection module and a second portion of the CMOS chip which is not overlaid;
the second bondpads of the interconnection module and the second bonding wires and the second portion of the CMOS chip which is not overlaid by the interconnection module being encapsulated by the plastic package.

9. A semiconductor pressure sensor assembly according to claim 1, further comprising a gel applied in the first cavity on top of the pressure sensor.

10. A semiconductor pressure sensor assembly according to claim 1, wherein the substrate of the interconnection module is made of a material selected from a group consisting of glass, silicon, germanium, alumina, a printed circuit board (PCB) material, a duroplast.

11. A semiconductor pressure sensor assembly according to claim 1, wherein the CMOS chip is an integrated circuit comprising a microprocessor and non-volatile memory.

12. A semiconductor pressure sensor assembly according to claim 1, wherein the CMOS chip further comprises second bondpads connected to the first substrate via third bonding wires, the third bonding wires also being encapsulated by the plastic package.

13. A semiconductor pressure sensor assembly according to claim 1, having outer dimensions smaller than 5 mm×10 mm×8 mm.

14. A method of manufacturing a pressure sensor assembly according to claim 1, comprising the steps of:
a) providing the first substrate;
b) providing the pressure sensor;
c) providing the interconnection module;
d) providing the CMOS chip;
e) mounting the CMOS chip on the first substrate;
f) mounting the interconnection module on the first substrate or on the CMOS chip;
g) applying second bonding wires to interconnect the second bondpads of the interconnection module and the first bondpads of the CMOS chip;
h) optionally applying third bonding wires to interconnect second bondpads of the CMOS chip and the first substrate;
i) applying a plastic package to cover or encapsulate at least the CMOS chip, and the first bondpads of the CMOS chip, and the second bonding wires, and the second bondpads of the interconnection module by a corrosion-resistant plastic,
in such a way as to leave the first bondpads of the interconnection module exposed, and
in such a way as to form a cavity sufficiently large to accommodate the pressure sensor;
j) mounting the pressure sensor in the cavity to the first substrate or to the plastic package or to the interconnection module;
k) applying first bonding wires to interconnect the first bondpads of the pressure sensor and the first bondpads of the interconnection module such that electrical connection is provided between the pressure sensor and the CMOS chip via the conductive paths of the interconnection module.

15. Use of a semiconductor pressure sensor according to claim 1 for measuring a pressure of an exhaust gas of an automobile engine.

16. A semiconductor pressure sensor assembly according to claim 1,
wherein the first substrate is a lead frame that includes a copper lead frame or a copper-based lead frame.

17. A semiconductor pressure sensor assembly according to claim 1,
wherein the second corrosion resistant material is a single metal selected from Au, Pt, Pd, Ta, Ti, W, Ag, or Mo; or
wherein the second corrosion resistant material is a metal alloy including one or more of Au, Pt, Pd, Ta, Ti, W, Ag, Mo; or
wherein the second corrosion resistant material is a metal alloy including two or more of Au, Pt, Pd, Ta, Ti, W, Ag, Mo; or
wherein the second corrosion resistant material is a Ni—Pd—Au stack.

18. A semiconductor pressure sensor assembly according to claim 1, wherein the substrate of the interconnection module is made of a material that includes glass, silicon, germanium, alumina, a printed circuit board (PCB) material, or a duroplast.

19. A semiconductor pressure sensor assembly according to claim 1, having outer dimensions smaller than 2.4 mm×5.0 mm×4.0 mm.

20. A semiconductor pressure sensor assembly according to claim 1, having outer dimensions smaller than 2.0 mm×3.0 mm×3.0 mm.

* * * * *